United States Patent
Kawaguchi

(10) Patent No.: US 6,868,027 B2
(45) Date of Patent: Mar. 15, 2005

(54) SEMICONDUCTOR MEMORY DEVICE HAVING A DRAM CELL STRUCTURE AND HANDLED AS A SRAM

(75) Inventor: Yasunari Kawaguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 7 days.

(21) Appl. No.: 10/739,374

(22) Filed: Dec. 18, 2003

(65) Prior Publication Data

US 2004/0130959 A1 Jul. 8, 2004

(30) Foreign Application Priority Data

Dec. 20, 2002 (JP) .......................... 2002-370697

(51) Int. Cl.[7] .............. G11C 7/00; G11C 8/00
(52) U.S. Cl. ............. 365/222; 365/207; 365/233.5
(58) Field of Search ................. 365/222, 205, 365/207, 230.08, 233.5

(56) References Cited

U.S. PATENT DOCUMENTS

| | | | | |
|---|---|---|---|---|
| 5,596,545 A | * | 1/1997 | Lin | 365/222 |
| 5,877,990 A | * | 3/1999 | Kim | 365/189.05 |
| 6,282,606 B1 | * | 8/2001 | Holland | 365/222 |
| 6,388,934 B1 | * | 5/2002 | Tobita | 365/222 |
| 6,563,754 B1 | * | 5/2003 | Lien et al. | 365/222 |
| 6,714,479 B2 | * | 3/2004 | Takahashi et al. | 365/222 |
| 6,721,224 B2 | * | 4/2004 | Eaton et al. | 365/222 |

FOREIGN PATENT DOCUMENTS

JP 2002-074944 3/2002

* cited by examiner

Primary Examiner—Trong Phan
(74) Attorney, Agent, or Firm—Choate, Hall & Stewart

(57) ABSTRACT

A semiconductor memory device includes a memory cell array including a plurality of memory cells having a DRAM cell structure and is treated as a SRAM memory device without controlling the data refreshing cycle for the memory cells. The refreshing cycle is separated into a read operation and a write operation, which sandwich therebetween a read/write operation for the input address of the memory cell. The data read in the refreshing cycle is saved in a refreshing sense amplifier during the read/write operation and stored in the memory cell after the read/write operation.

11 Claims, 16 Drawing Sheets

SEMICONDUCTOR MEMORY DEVICE HAVING A DRAM CELL STRUCTURE AND HANDLED AS A SRAM

BACKGROUND OF THE INVENTION (a) Field of the Invention

The present invention relates to a semiconductor memory device having a DRAM (dynamic random access memory) cell structure and handled as a SRAM (static random access memory).

(b) Description of the Related Art

Semiconductor memory devices which have a DRAM cell structure and operating as SRAMs in the specification as viewed from the outside now play an important role in improving the functions of cellular phones which have been developed rapidly in these days. The advantages of this type of semiconductor memory device (may be referred to as simply "memory device" hereinafter) are that a periodic refreshing control from outside the memory device for maintaining the data stored in the memory cells, as encountered in the DRAM, is not needed to thereby allow easy handling thereof, and that the memory device has a larger capacity compared to the SRAM due to the simple DRAM cell structure.

It is to be noted that the memory device requires in fact the refreshing operation for maintaining the data stored in the memory cells, because the memory device has DRAM cells in the memory cell array thereof. Nevertheless, due to the SRAM specification, the memory device has no refreshing control terminal for controlling the refreshing operation from outside the memory device. This necessitates the memory device to include therein a self refreshing control circuit for generating a refreshing request signal each time a refreshing time interval elapses.

The refreshing request signal for requesting the refreshing operation for the memory cells is delivered in the memory device at a refreshing cycle, which is calculated based on the data hold time of the memory cells. The refreshing request signal is delivered at any time of the processing in the memory device, and the stop of the refreshing operation after starting the refreshing operation may destroy stored data. Thus, some operation cycle of the memory device includes both the refreshing operation and a read/write operation for the input address supplied from outside the memory device. This makes it difficult to obtain a high operational speed in the memory device comparable to that of the SRAM which does not include the refreshing operation. It is desired that the memory device have larger capacity, lower operating voltage and higher-speed operation in view of the possible further development of the functions of the cellular phones.

FIG. 14 shows the conventional memory device (first conventional memory device) described in Patent Publication JP-A-2002-74944, and FIG. 15 shows a timing chart for the operation of the memory device of FIG. 14.

In the memory device of FIG. 14, an address transition detected signal (address transition signal) ATD is generated in response to a transition of the input address or a fall of the chip select signal /CS, followed by a refreshing operation in response to the address transition signal ATD and a successive read/write operation for the input address ADD supplied from outside the memory device.

Due to the refreshing operation performed before the read/write operation, it is sufficient that the input address ADD be fixed at the time of starting the read/write operation, which fact allows a considerable skew in the input address ADD. The term "skew" as used herein means a time interval between the time instant at which the first part of the input address ADD reaches the memory device and the time instant at which the last part of the input address ADD reaches the memory device to determine the input address ADD. It is to be noted that there arise a skew in the input address because a plurality of address lines transmit the input address ADD and have different transmission delays therethrough, and that the memory device starts for the read/write operation upon the delivery of the first part of the input signal and yet should perform the actual read/write operation after the delivery of the last part of the input signal.

In addition, the consecutive refreshing operation and read/write operation avoid a conflict between these operations to thereby avoid destruction of the stored data without delaying the start of the read/write operation. Further, there arises no conflict even if the write enable signal /WE is delayed during a write operation.

In a read operation for the input address, a one-shot pulse having a positive polarity (positive one-shot pulse) is generated in the address transition signal ATD, when the input address ADD changes with both the chip select signal /CS and the address latch signal LC being at a low level. If a refreshing request signal REF1 assumes a high level at this stage, a refreshing address R_ADD generated by a refreshing control circuit 4A is delivered to a multiplexer circuit 5 due to the high level of the address transition signal ATD; whereby the multiplexer circuit 5 delivers an internal address signal A_R1 as the selected address M_ADD. A row control circuit 13A delivers a positive one-shot pulse in a row enable signal RE.

The selected address M_ADD and the row address enable signal RE select the word address Ref_Word of the refreshing address, thereby starting the refreshing operation. More specifically, a read operation of the refreshing cycle is performed at the rising edge of the sense amplifier enable signal SE, followed by a rewrite operation of the refreshing cycle for the memory cell during the high level of the sense amplifier enable signal SE, After the rewrite operation is completed, a positive one-shot pulse is generated in a precharge enable signal PE to perform a precharge operation for the bit lines. Since the refreshing operation does not request output of data stored in the memory cells, a column enable signal CE stays at an inactive low level.

After the refreshing operation is completed, address transition signal ATD assumes a low level, and the address latch signal LC output from a latch control circuit 12 assumes a high level, whereby the input address ADD delivered from outside the memory device is latched. The latch timing of the input address ADD is set at the end of the refreshing cycle. This allows an address skew equivalent to the refreshing time interval to obviate any problem.

The latched input address L_ADD latched by the latch circuit 2 is delivered from the multiplexer circuit 5 as the selected address M_ADD. A positive one-shot pulse in the row enable signal RE selects the word address Nor-Word of the input address ADD to start a read operation, similarly to the refreshing operation. While setting the column enable signal CE at a high level, the read data from the input address ADD is delivered through the read/write bus WRB in response to the rising edge of the bit line selection signal Yj. The read data on the read/write bus WRB is then output through the I/O terminals in response to an output buffer enable signal CWO. It is to be noted that tAA shown in FIG. 15 represents the address access time.

If a trigger for generating the address transition signal ATD is not provided from outside the memory device within a specified delay time after refreshing request signal REF1 rises to a high level, a pulse generator circuit disposed in the refreshing control circuit 4A and activated by a rise of the delayed signal of refreshing request signal REF1 generates a negative one-shot pulse in refreshing request signal REF2. The fall of refreshing request signal REF2 allows the refreshing address "A_R1+1" generated by the refreshing control circuit 4A to be delivered from the multiplexer circuit 5 as the selected address M_ADD. On the other hand, a row control circuit 13A delivers a positive one-shot pulse in the row enable signal RE.

The word address Ref_Word of the refreshing address R_ADD is selected based on the selected address M_ADD and the row enable signal RE, thereby performing a refreshing operation. More specifically, a read operation is conducted in response to a rise of the sense amplifier enable signal SE, followed by a rewrite operation during the high level of the sense amplifier enable signal SE. After the rewrite operation is completed, a positive one-shot pulse is generated in the precharge enable signal PE for precharging the bit lines.

In the conventional memory device as described above, since the read operation is performed after waiting for the time length needed for completing the refreshing operation, the start of the read/write operation need not be delayed with respect to the timing of the address skew and the write enable signal /WE. However, there is a problem in the conventional memory device that the read time for the input address cannot be reduced.

The above patent publication also describes a second conventional memory device, which solves the above problem to thereby reduce the read time for the input address. In the second conventional memory device, a read operation for the input address is performed before the refreshing operation, while performing the refreshing operation before a write operation for the input address.

It is to be noted in the second conventional memory device that a judgement is essential as to whether the input address is directed to a read operation or a write operation before performing the refreshing operation. This necessitates provision of a time interval tAW_max between the address transition and the establishment of the write enable signal /WE. In other word, the judgement must be completed between the read operation and the write operation within the time interval set by tAW_max. Similarly, the start of the read operation must be determined in consideration of the skew (tskew) of the input address.

FIG. 16 shows a timing chart for the second conventional memory device in the refreshing operation and the read operation.

When the input address ADD is changed with both the chip select signal /CE and address latch signal LC being at a low level, a positive one-shot pulse is generated in the address transition signal ATD after the time length set by tAW_max or tskew elapses. Since the write enable signal /WE assumes an inactive high level, a read operation is started, wherein the input address ADD supplied from outside the memory device is latched by the address latch signal LC output from the latch control circuit 12.

Thereafter, the read operation for the input address is performed similarly to the first conventional memory device, delivering the read data through the I/O terminals.

The refreshing operation for the refreshing address "A_R1" is performed after the completion of the read operation. In the, second conventional memory device, tAA as shown in FIG. 16 represents the address access time. In this case, if the time interval tAW_max and the skew (tskew) are set smaller than the refreshing time interval, the access time tAA is reduced compared to the first conventional memory device.

It is to be noted that the refreshing operation is started by refreshing control signal REF2, similarly to the first conventional memory device, if a trigger for generating the address transition signal ATD is not supplied from outside the memory device within a specified time length after refreshing control signal REF1 rises to a high level. If a read request signal is generated just after the refreshing operation is started, the refreshing operation cannot be stopped because the stop of the refreshing operation may cause a destruction of the data stored in the memory cell now subjected to the refreshing operation.

More specifically, if the refreshing operation is started in response to the change of the input address ADD etc. supplied from outside the memory device, the refreshing operation can be performed after the read operation. On the other hand, if the self-refreshing operation is started before the request of the read operation, the read operation cannot be performed until the refreshing operation is completed. Thus, the access time is equivalent to the case wherein the read operation is conducted after the refreshing operation is completed in the first conventional memory device, and therefore cannot be reduced in fact. In addition, there may be a waste of the operating time because both the refreshing operation and read/write operation cannot be performed during the time interval of tAW_max or tskew.

In view of the above, it is an object of the present invention to provide a semiconductor memory device of the type as described above and capable of operating at a higher speed.

The present invention provides a semiconductor memory device including: a memory cell array including a plurality of memory cells each having a DRAM cell structure; an input block for receiving an input address for a read/write operation from outside the memory device and generating an address transition signal upon receipt of the input address; a refreshing control circuit for controlling a refreshing cycle of the memory cell array, the refreshing control circuit generating a refreshing address for which data refreshing is to be performed; and a sense amplifier circuit for amplifying and reading/writing data from/into one of the memory cells specified by the input address or the refreshing address, the sense amplifier circuit including a temporary data memory for saving refreshing data read from the memory cells during the refreshing cycle, wherein the temporary data memory, saves the refreshing data if the address input block generates the address transition signal during the refreshing cycle.

The present invention also provides a method for controlling a semiconductor memory device having a DRAM cell structure, the method including the steps of: reading first data from a first memory cell specified by a refreshing address into a sense amplifier circuit in a refreshing cycle; responding to an input address to read/write second data in a second memory cell specified by the input address into the sense amplifier circuit after saving the first data therein; and writing the first data saved in the sense amplifier circuit into the first memory cell in the refreshing cycle.

In accordance with the semiconductor memory device and the method of the present invention, the access time of the read/write operation for the input address can be reduced due to the separation of the refreshing cycle into the read operation and the write operation of the refreshing cycle.

The above and other objects, features and advantages of the present invention will be more apparent from the following description, referring to the accompanying drawings.

PREFERRED EMBODIMENT OF THE INVENTION

Before describing embodiments of the present invention, the principle of the present invention will be described hereinafter for a better understanding of the present invention.

The following reference symbols are used and described throughout the specification and figures: chip select signal /CS, voltage VCC, sense amplifier enable signal SE, precharge enable signal PE, refreshing sense amplifier enable signal R_SE, sense amplifier selection signal S_SW, column enable signal CE, column control signal CC, latch control signal LC, row enable signal RE, write enable signal /WE, address comparison signal HIT, output buffer enable signal CWO, read/write bus WRB, bit lines BT and BN, input address ADD, address transition signal ATD, bit line selection signal $Y_j$, input/output I/O, refreshing request signals REF1, REF2 and REF 3, latched address L_ADD which includes a row address L_ADDm and a column address L_ADDn selected address M_ADD, refreshing address R_ADD, word addresses Ref_Word and Nor_ Word, input addresses A1 and A2, refreshing addresses A_R1 and A_R1+1, time interval between read and write operations tAW_max, time interval the time instance at which the first part of the input address reaches the memory device and the time instance at which the last part of the input address reaches the memory device tskew, and address access time tAA.

Figure 5A:
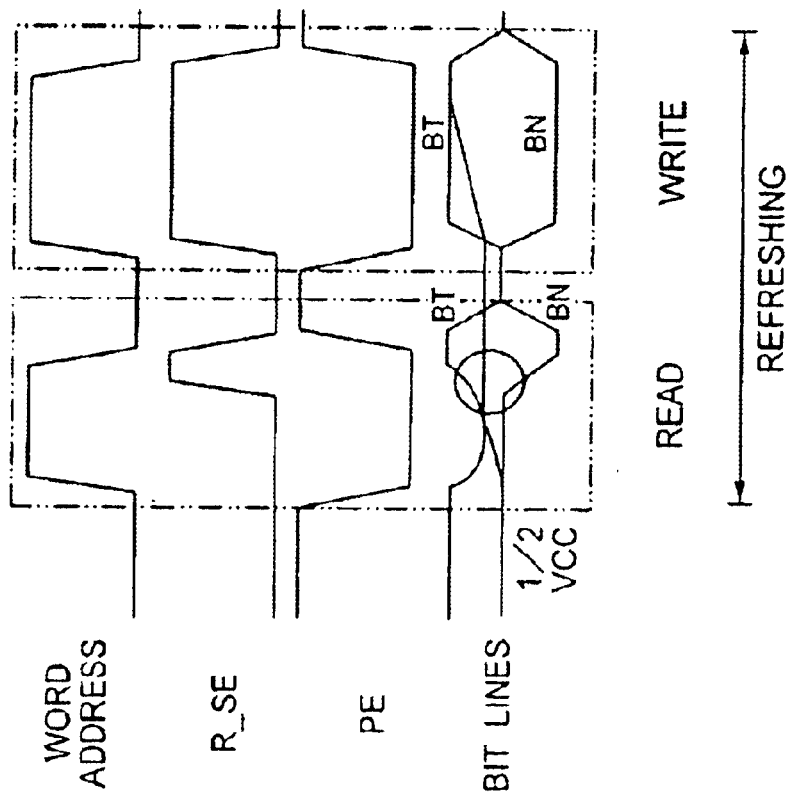
FIGS. 5A and 5B are timing charts of the refreshing cycles in the memory devices of the conventional technique and of the first embodiment, respectively.

Referring to FIG. 5A showing a timing chart of the refreshing cycle in the conventional memory device, the refreshing cycle has roughly two operations including a read operation and a rewrite operation. The read operation of the refreshing cycle starts with a word selection step and ends with an amplifier enable step. The rewrite operation of the refreshing cycle is such that the data read in the read operation is stored again into the original memory cell.

The read operation of the refreshing cycle is such that the data stored in the memory cell specified by the word address (WORD ADDRESS) is delivered to the bit lines (bit line pair) (BIT LINES) and that the bit lines to which data is not delivered from the memory cell are set at the reference level. After a differential potential level which the sense amplifier circuit can detect is output to the bit lines based on the word selection, the data on the bit line pair is sensed and amplified by enabling the sense amplifier circuit and then written into the memory cells.

In the exemplified refreshing operation of FIG. 5A, the data stored in the memory cell having a data of high level is delivered to bit line 1T to allow the data to be sensed and amplified while using bit line BN as a reference. Thereafter, bit line BT is raised to the VCC level and bit line BN is lowered to the ground level for rewriting the data of the high level to the memory cell. The rewrite operation includes a precharge operation wherein the bit line pair are allowed to assume a 1/2 VCC level for the next operation.

Figure 5B:
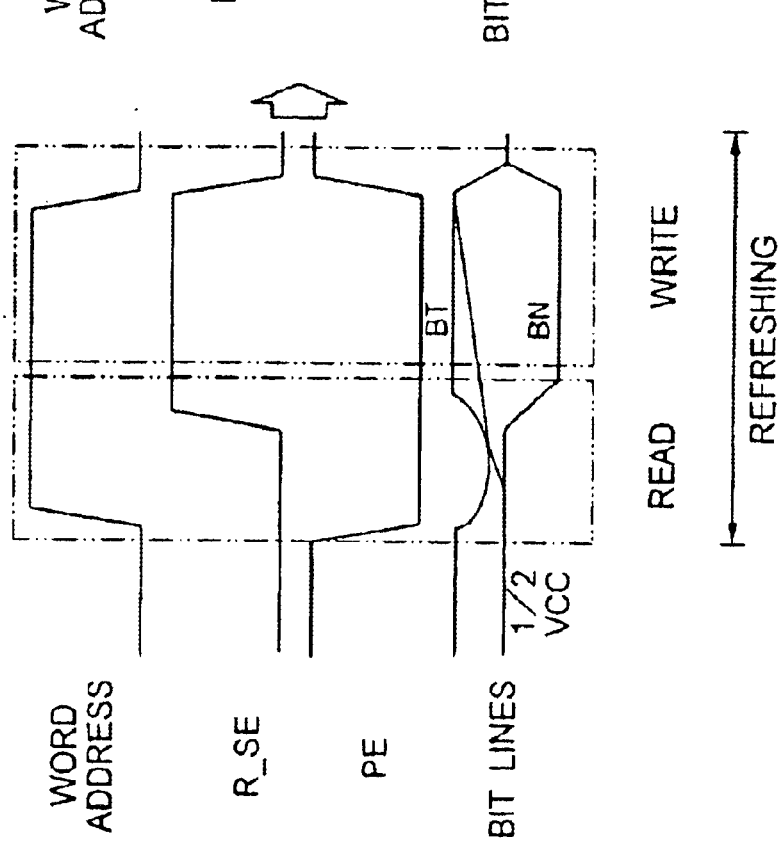

On the other hand, as will be understood from FIG. 5B, according to the present invention, after the data is read from the memory cell of high level, the data is temporarily saved to separate the rewrite operation from the read operation in the refreshing cycle.

More concretely, a refreshing sense amplifier (92 in FIG. 2) is provided in the present invention separately from the read/write sense amplifier (91 in FIG. 2) for the input address, whereby it is possible to save the data read from the memory cell into the refreshing sense amplifier without immediately storing the same into the memory cell. If a read/write request signal is delivered from outside the memory device during the refreshing operation, the read/write operation responding to the request signal is performed immediately, followed by storing the data saved in the refreshing sense amplifier into the memory cell.

Now, the present invention is more specifically described with reference to accompanying drawings, wherein similar constituent elements are designated by similar reference numerals throughout the drawings.

Figure 1:
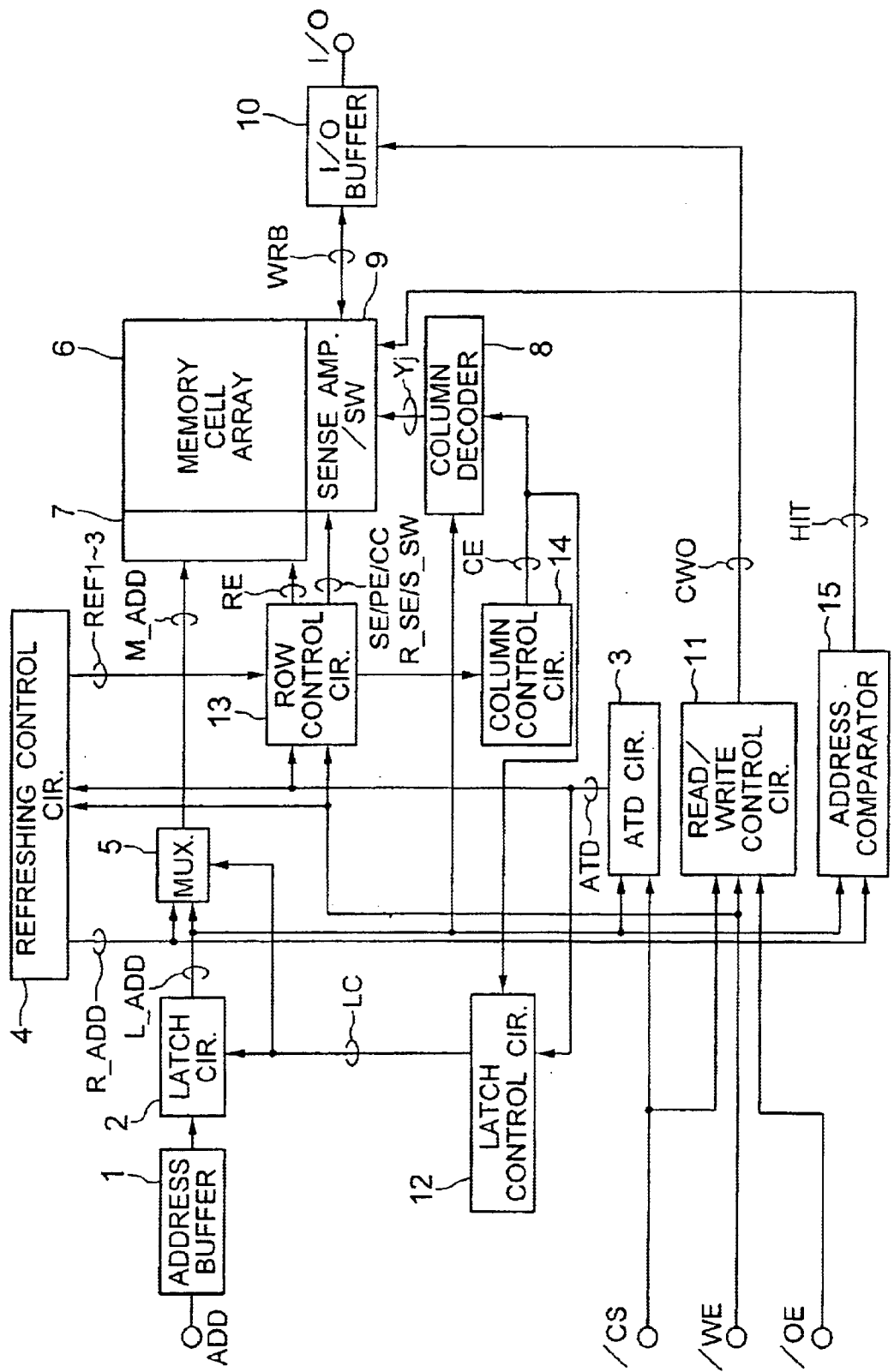
FIG. 1 is a block diagram of a memory device according to a first embodiment of the present invention.

Referring to FIG. 1, there is shown a memory device according to a first embodiment of the present invention. The memory device includes address buffer block 1, latch circuit 2, address transition detection (ATD) circuit 3, refreshing control circuit 4, multiplexer circuit 5, latch control circuit 12, read/write control circuit 11, address comparator circuit 15, row control circuit 13, column control circuit 14, row decoder 7, column decoder 8, sense amplifier/switch circuit 9, memory cell array 6 and I/O buffer block 10.

Symbol ADD represents an input address supplied from outside the memory device. The address buffer circuit 1 receives the input address ADD to deliver the same to the latch circuit 2, which delivers the input address ADD supplied from the address buffer circuit 1 as a latched address L_ADD if a latch control signal LC assumes a low level. If the latch control signal LC assumes a high level, the latch circuit 2 holds the latched address L_ADD latched at the rising edge of the latch control signal LC. The latched address L_ADD includes a row address L_ADDm and a column address L_ADDn.

The ATD circuit 3 generates a positive one-shot pulse in the address transition signal ATD, if at least one bit of the latched address L_ADD changes when the chip select signal /CS assumes an active low level. If the chip select signal /CS falls to an active low level, the ATD circuit 3 generates a positive one-shot pulse in the address transition signal ATD. The chip select signal /CS allows the memory device to assume a selected state during a low level of the chip select signal and a non-selected state during a high level of the chip select signal.

The refreshing control circuit 4 includes therein an is address counter (not shown) for consecutively generating a plurality of refreshing addresses R_ADD for the memory cells to be refreshed, and a refreshing timer (not shown) for generating a refreshing request signal.

The refreshing address counter counts up bit by bit of the refreshing address R_ADD based on the timing of the refreshing timer, the refreshing address R_ADD having a bit width equal to the bit width of the input address ADD. The refreshing timer generates a trigger signal for starting a refreshing cycle at a constant interval. The refreshing control circuit 4 delivers refreshing request signals REF1, REF2 and REF3 for controlling the refreshing operation based on the timings generated by the refreshing timer.

Refreshing request signal REF1 controls the refreshing operation while responding to the change of each of external signals including the input address ADD, chip select signal /CS and write enable signal /WE, which are delivered from outside the memory device. Refreshing request signals REF2 and REF3 control the refreshing operation when these external signals do not change.

Refreshing request signal REF1 assumes a high level, responding to a trigger signal delivered from the refreshing timer at the timing when the refreshing operation is needed. If an external signal changes when refreshing request signal REF1 assumes a high level, refreshing request signal REF1 is reset to a low level after the refreshing operation is completed. If the external signals do not change within a specified timing after refreshing request signal REF1 rises to a high level, a negative one-shot pulse is generated in refreshing request signal REF2 by a delayed signal delayed from the rising edge of refreshing request signal REF1, followed by resetting refreshing request signal REF1 to a low level. In addition, if the external signals do not change after the generation of the one-shot pulse in refreshing request signal REF2, a negative one-shot pulse is generated in refreshing request signal REF3 by a delayed signal delayed from the falling edge of the one-shot pulse in refreshing request signal REF2.

After the refreshing operation for a memory cell is completed, the refreshing address R_ADD is counted up by one bit. The pulse width of the negative one-shot pulse in refreshing request signal REF2 is set at the time interval of the word selection needed for the read operation of the refreshing cycle. The pulse width of the one-shot pulse in refreshing request signal REF3 is set at the time interval of the word selection needed for rewrite operation of the refreshing cycle.

The multiplexer (MUX) circuit 5 delivers, as a selected address M_ADD, either one of the refreshing address R_ADD and the row address L_ADDm of the latched address L_ADD obtained by latching the input address ADD. More specifically, the multiplexer circuit 5 delivers the refreshing address R_ADD at a low level of the latch control signal LC, and delivers the row address L_ADDm of the latched address L_ADD at a high level of the latch control signal LC, as the selected address M_ADD in either case.

The memory cell array 6 includes a plurality of memory cells arranged in a matrix and each having a DRAM cell structure including a single transistor and a single capacitor.

The row decoder 7 decode the selected address M_ADD at a high level of the row enable signal RE to select a word line. If the row enable signal RE assumes a low level, all the word lines are inactivated.

The column decoder 8 decodes the column address L_ADDn of the latched address L_ADD at a high level of the column enable signal CE to activate a column selection signal Yj for selecting a bit line pair. If the column enable signal. CE assumes a low level, all the column selection signals Yj are inactivated, similarly to the case of word lines.

Figure 2:
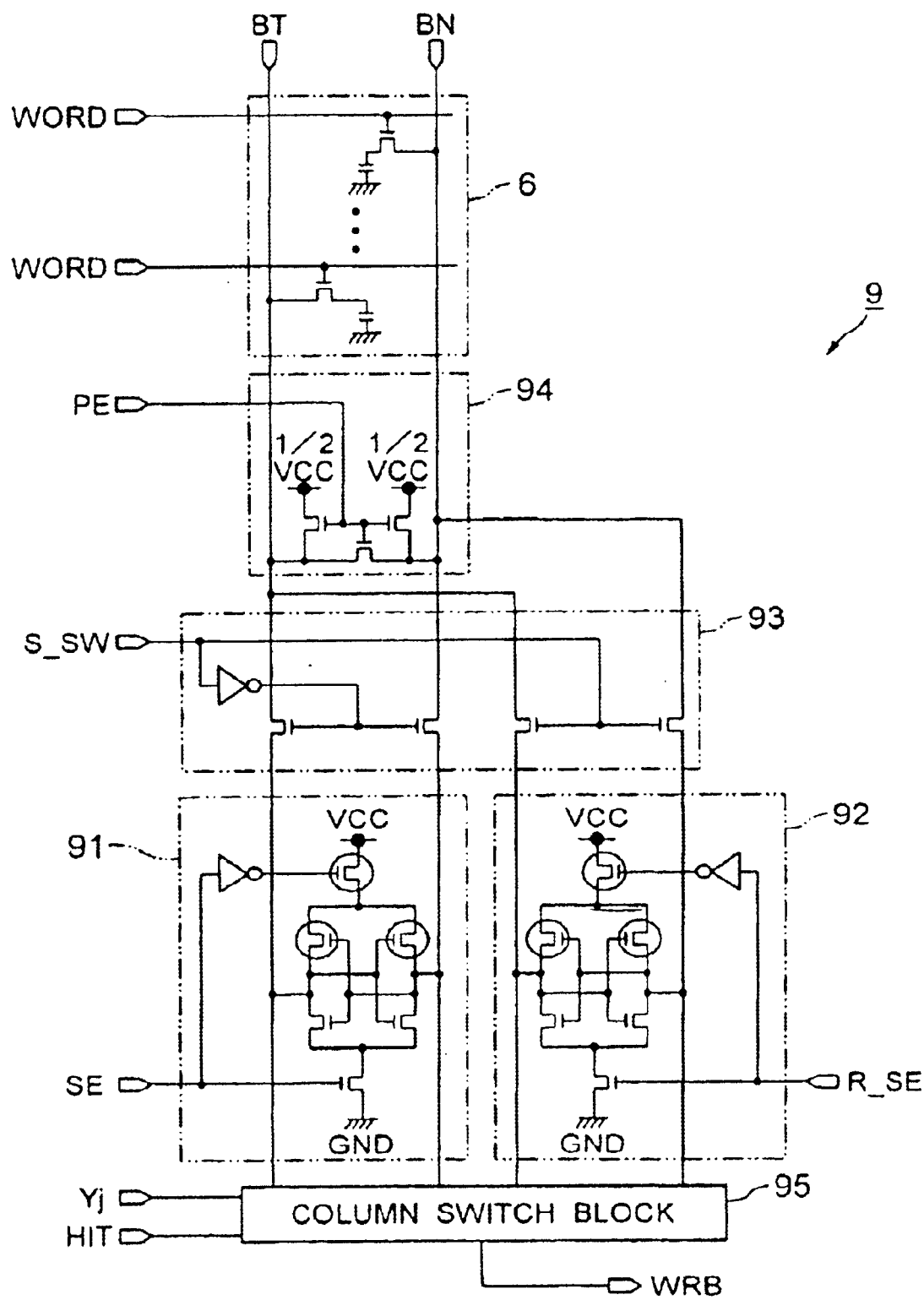
FIG. 2 is a schematic circuit diagram of the sense amplifier/swtich circuit and associated memory cell array in the memory device of FIG. 1.

Referring to FIG. 2, the sense amplifier/switch circuit 9, includes read/write sense amplifier (block) 91, refreshing sense amplifier (block) 92, sense amplifier selection circuit 93, precharge circuit 94, and column switch (block) 95, which are disposed along the extended column direction of the memory cell array 6.

The column switch block 95 couples a sense amplifier to the read/write bus WRB, the sense amplifier being selected by the column selection signal Yj output from the column decoder 8 and the address comparison signal HIT output from the address comparator circuit 15.

The sense amplifier block 91 is activated by a high level of the sense amplifier enable signal SE, to amplify the data (WORD) stored in the selected memory cell during a read operation and write the data on the read/write bus WRB into the selected memory cell via bit lines BT and BN.

The refreshing sense amplifier block 92 is activated by a high level of the refreshing sense amplifier enable signal R_SE to amplify and rewrite the data into the selected memory cell.

The precharge circuit 94 is activated by a high level of the precharge enable signal PE to precharge the bit line pair to a 1/2 VCC level.

The sense amplifier selection circuit 93 switches between the read/write sense amplifier block 91 and the refreshing sense amplifier block 92, selecting the read/write sense amplifier block 91 at a low level of the sense amplifier selection signal S_SW and the refreshing sense amplifier block 92 at a high level of the sense amplifier selection signal S_SW.

The I/O buffer block 10 delivers read data on the read/write bus WRB through the I/O terminals at a high level of the output buffer enable signal CWO while using an output buffer (not shown) disposed therein. In a write operation, the output buffer enable signal CWO assumes a low level to thereby disable the output buffer due to a high impedance state thereof, wherein the write data supplied from outside the memory device through the I/O terminals is delivered by an input buffer disposed in the I/O buffer block 10 to the read/write bus WRB.

The read/write control circuit 11 generates the output buffer enable signal CWO based on the chip select signal /CS, write enable signal /WE and output enable signal /OE. The output buffer enable signal CWO assumes a high level upon a low level of the chip select signal /CE, a high level of the write enable signal /WE or a low level of the output enable signal /OE, and otherwise assumes a low level.

Figure 3:
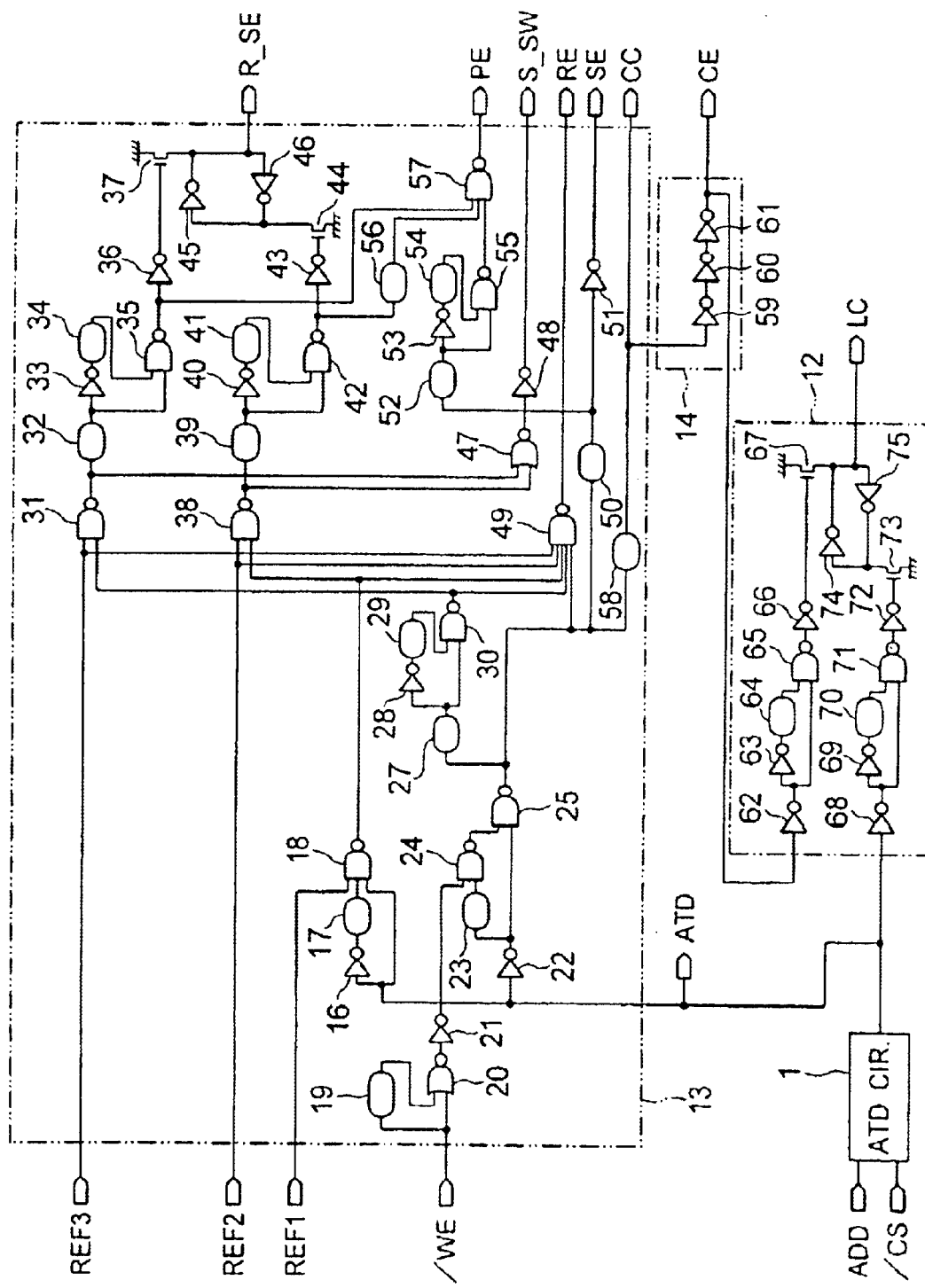
FIG. 3 is a circuit diagram of the row control circuit in the memory device of FIG. 1.

The latch control circuit 12 generates the latch control signal LC, used for latching the input address ADD, based on the address transition signal ATD and the column enable signal CE. Referring to FIG. 3, the latch control circuit 12 includes inverters 68 and 69, delay gate 70, NAND gate 71, inverter 72 and n-ch transistor 73, which raise the latch control signal LC to a high level at a falling edge of the address transition signal ATD, thereby allowing the latch circuit 2 to hold the latched address L_ADD. The latch control circuit 12 also includes inverters 62 and 63, delay gate 64, NAND gate 65, inverter 66 and n-ch transistor 67, which lower the latch control signal LC to a low level at a falling edge of the column enable signal CE, thereby allowing the latch circuit 2 to release the latched address L_ADD. Inverters 74 and 75 hold the latch control signal LC.

The row control circuit 13 generates row enable signal RE, read/write sense amplifier enable signal SE, refreshing sense amplifier enable signal R_SE, sense amplifier selection signal S_SW, precharge enable signal PE and column control signal CC based on the refreshing request signals REF1, REF2 and REF3, address transition signal ATD and write enable signal /WE.

If the address transition signal ATD rises to a high level when refreshing request signal REF1 assumes a high level, inverter 16, delay gate 17 and NAND gate 18 generate a negative one-shot pulse having a pulse width corresponding to the delay in delay gate 17, thereby generating a positive one-shot pulse in the row enable signal RE. Delay gate 17 has a delay corresponding to a word width (pule width of the row enable signal RE) needed for read operation of the refreshing cycle.

When NAND gate 18 delivers the negative one-shot pulse, NAND gate 38, delay gate 39, inverter 40, delay gate 41 and NAND gate 42 generate a negative one-shot pulse, thereby allowing inverter 43 and n-ch transistor 44 to raise the refreshing sense amplifier enable signal R_SE to a high level and allowing delay gate 56 and NAND gate 57 to raise the precharge enable signal PE to a high level. Delay gate 39 has a delay time corresponding to the time interval between the selection of word line and activation of the sense amplifier block. Delay gate 41 has a delay time corresponding to the time interval for the precharge (pulse width of the precharge enable signal PE) needed after the read operation of the refreshing cycle. Delay gate 56 has a delay time for determining the start of the precharge.

If the address transition signal ATD falls to a low level when the write enable signal /WE assumes a high level, inverter 22, delay gate 23, and NAND gates 24 and 25 generate a negative one-shot pulse to thereby generate a positive one-shot pulse in each of the row enable signal RE, sense amplifier enable signal SE and precharge enable signal PE and a negative one-shot pulse in the column control signal CC which is connected to the output of NAND gate 25 through delay gate 58. Delay gate 50 has a delay time corresponding to the time interval between the selection of the word line and activation of the sense amplifier block, delay gate 52 has a delay time for determining the precharge start time, and delay gate 54 has a delay time corresponding to the time interval of the precharge needed after the read/write operation.

When the output of NAND gate 25 rises to a high level, delay gate 27, inverter 28, delay gate 29 and NAND gate 30 generate a negative one-shot pulse, thereby generating a positive one-shot pulse in the row enable signal RE. Delay gate 27 determines the end of the precharge during the read/write operation, and delay gate 29 has a delay time corresponding to the word width needed for rewrite operation of the refreshing cycle.

After the output of NAND gate 30 assumes a low level, NAND gate 31, delay gate 32, inverter 33, delay gate 34 and NAND gate 35 deliver a negative one-shot pulse, allowing inverter 36 and n-ch transistor 37 to lower the refreshing sense amplifier enable signal R_SE to a low level and allowing NAND gate 57 to raise the precharge enable signal PE to a high level. Delay gate 32 has a delay time corresponding to the time interval between word selection for the write operation of the refreshing cycle, whereas delay gate 34 has a delay time corresponding to time interval of the precharge operation needed after the write operation of the refreshing cycle.

NOR gate 47 and inverter 48 raise the sense amplifier selection signal S_SW to a high level when the output of NAND gate 31 or 38 assumes a high level. Delay gate 19, NOR gate 20 and inverter 21 allow the output of NAND gate 25 to assume a low level, thereby prohibiting generation of a one-shot pulse in the row enable signal RE, sense amplifier enable signal SE, column control signal CC and precharge enable signal PE, if the write enable signal /WE falls to a low level before the address transition signal ATD rises to a high level.

The column control circuit 14 generates the column enable signal CE by delaying the column control signal CC while using delay gates 59 to 61.

Figure 4:
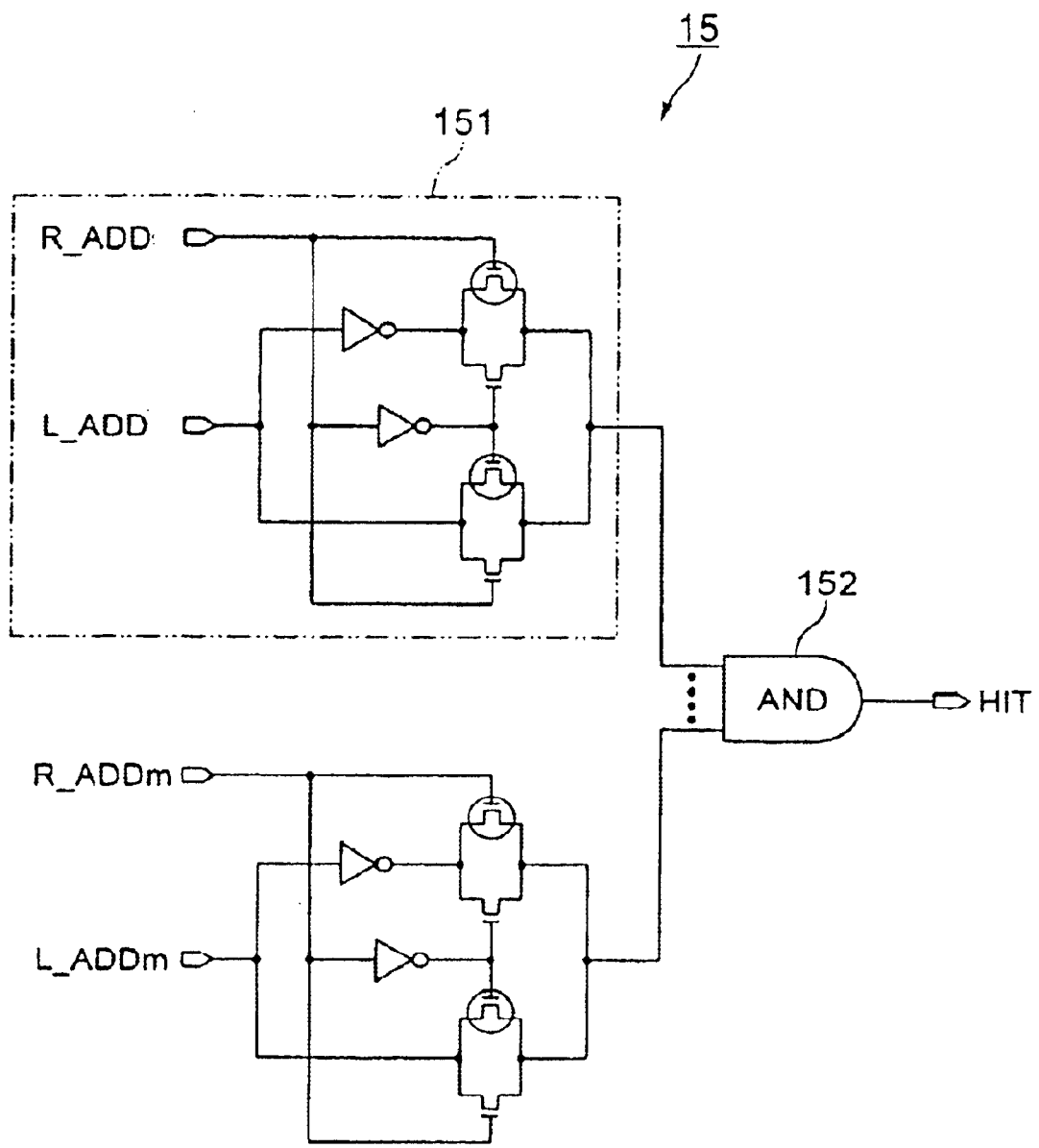
FIG. 4 is a circuit diagram of the address comparator in the memory device of FIG. 1.

Referring to FIG. 4, the address comparator circuit 15 compares the row address of the refreshing address R_ADD generated by the refreshing control circuit 4 against the row address of the latched address L_ADD output from the latch circuit 2. The address comparator circuit 15 includes a comparator 151 for each column address, the comparator 151 comparing each bit of the refreshing address R_ADDm against the corresponding bit of the latched address L_ADD. As understood from FIG. 4, the comparator 151 delivers a coincidence signal if both the bits coincide, and AND gate. 152 calculates a logical product of all the coincidence signals. AND gate 152 delivers a high level in the address comparison signal HIT if all the bits coincide between the latched address L_ADD and the refreshing address R_ADD, and a low level in the address comparison signal HIT if at least one of the bits does not coincide.

Figure 6:
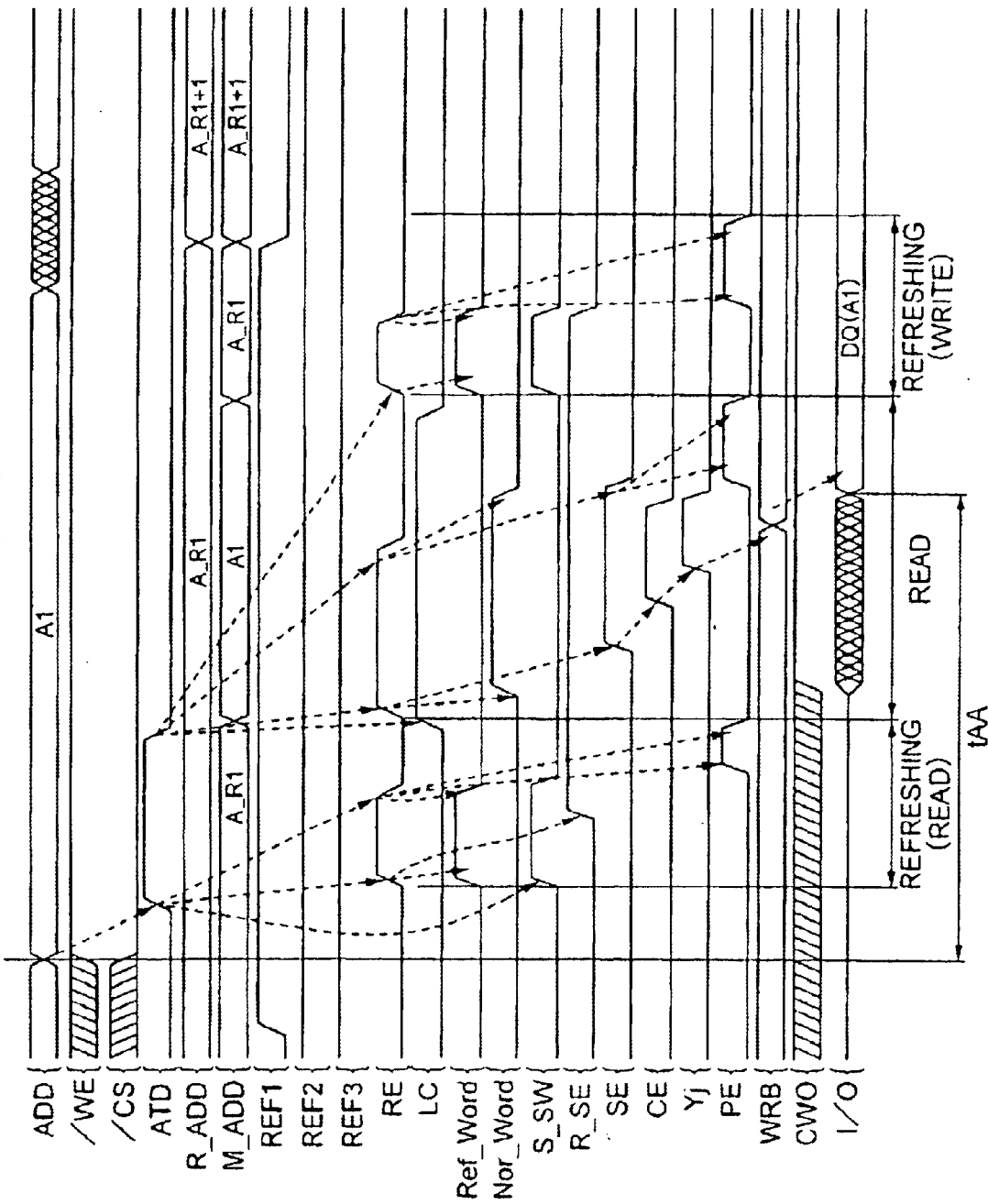
FIG. 6 is a timing chart of the refreshing operation and a read operation in the memory device of FIG. 1.

Referring to FIG. 6, there is shown a read operation performed in the case where the input address ADD changes when refreshing request signal REF1 assumes a high level.

If the input address ADD changes when both the chip select signal /CS and the address latch signal LC assume a low level, the address transition signal ATD delivers a positive one-shot pulse. Since refreshing request signal REF1 assumes a high level, the rising edge of the address transition signal ATD allows the refreshing address "A_R1" generated by the refreshing control circuit 4 to be output from the multiplexer circuit 5 as the selected address M_ADD, and the negative one-shot pulse output from NAND gate 18 of the row control circuit 13 generates a positive one-shot pulse in each of the row enable signal RE and sense amplifier selection signal S_SW.

The refreshing sense amplifier 92 and bit lines BT and BN are coupled together by the high level of the sense amplifier selection signal S_SW, and the word address Ref_Word of the refreshing address "A_R1" is selected based on the selected address M_ADD and row enable signal RE, whereby a read operation of the refreshing cycle is started. After the word address Ref_Word is selected, next operation is waited for the time length set by delay gate 39 and needed for reading the data before the refreshing sense amplifier enable signal R_SE rises to a high level for sensing and amplifying the data to obtain a refreshing data. The refreshing sense amplifier enable signal R_SE is held at the high level by inverters 45 and 46 for holding the refreshing data in the refreshing sense amplifier 92 until the data is rewritten in the original memory cell.

After the time instant when the sense amplifier selection signal S_SW falls to a low level with the refreshing data being held in the refreshing sense amplifier 92, the data stored in the memory cell can be discarded without a problem. Thus, the negative one-shot pulse delivered from NAND gate 42 is delayed in delay gate 56 by the time length for which the data is held, thereby allowing NAND gate 57 to generate a positive one-shot pulse in the precharge enable signal PE for precharging the bit lines. Since the rewrite operation is not performed at this stage and thus bit lines need not be driven to the VCC level and ground level, the precharge time can be set small due to the small potential difference needed between the bit lines.

After the precharge operation, the address transition signal ATD falls to a low level, a negative one-shot pulse is generated from NAND gate 71 in the latch control circuit 12, and the address latch signal LC is raised to a high level by inverter 72, n-ch transistor 73 and inverters 74 and 75, whereby the input address "A1" supplied from outside the memory device is latched. Since the positive one-shot pulse in the address transition signal ATD has a pulse width adjusted to the time length of read operation of the refreshing cycle, the input address "A1" is to be latched just after the read operation of the refreshing cycle is completed. This means that an address skew corresponding to the read time of the refreshing cycle, if any, causes no problem.

The row address of the latched address L_ADD in the latch circuit 2 is delivered from the multiplexer circuit 5 as the selected address M_ADD, and the word address Nor_Word of the input address "A1" is selected in response to the rising edge of the row enable signal RE, similarly to the refreshing operation, whereby the read operation for the input address ADD is started. After the word address Nor_Word is selected, next operation is waited for the read time of the refreshing cycle set by delay gate 50 before the read/write sense amplifier enable signal SE rises to a high level for sensing and amplifying the read data.

For delivering the read data through the I/O terminals, the column control signal CC is delayed by inverters 59 to 61 to raise the column decoder enable signal CE, whereby the column decoder 8 decodes the column address of the latched address L_ADD to deliver a bit line selection signal Yj. The read/write bus WRB then receives therein the data sensed and amplified by the sense amplifier. The data received by the read/write bus WRB is then delivered through the I/O terminals due to a high level of the output buffer enable signal CWO. Symbol tAA represents the address access time in this operation.

The data read by the read/write sense amplifier is rewritten in the memory cell of address "A1" within the time interval for the selection of the word address Nor_Word, followed by raising the precharge enable signal PE to a high level to precharge bit lines BT and BN. Delay gate 52 has a delay time adjusted to raise the precharge enable signal PE to a high level after the rewrite of data in the memory cell is completed.

NAND gate 65 in the latch control circuit 12 delivers a negative one-shot pulse in response to the falling edge of the column enable signal CE, allowing inverter 66, n-ch transistor 67 and inverters 74 and 75 to lower the address latch signal LC to a low level, whereby the multiplexer circuit 5 delivers the refreshing address "A_R1" as the selected address M_ADD.

After the precharge operation is completed, NAND gate 30 in the row control circuit 13 delivers a negative one-shot pulse, allowing NAND gate 49 to raise the row enable signal RE to a high level, whereby NAND gate 31, NOR gate 47 and inverter 48 raise the sense amplifier selection signal S_SW to a high level to thereby restart the refreshing operation. The rising edge of the sense amplifier selection signal S_SW couples the refreshing sense amplifier to the bit lines BT and BN, and the high level of the row enable signal RE selects the word address Ref_Word of the refreshing address "A_R1", thereby writing the refreshing data stored in the refreshing sense amplifier 92 into the memory cell.

After the rewrite of data into the memory cell is completed, NAND gate 35 generates a negative one-shot pulse, allowing inverters 36, n-channel transistor 37 and inverters 45 and 46 to lower the refreshing sense amplifier enable signal R_SE to a low level, which inactivates the refreshing sense amplifier 92. Thus, NAND gate 57 raises the precharge enable signal PE to precharge the bit lines, thereby completing the refreshing operation.

There is some problem in the above description if the refreshing address "A_R1" and the read address "A1" coincide with each other. More specifically, since the data in the memory cell has been discarded after the read operation of the refreshing cycle, the data held in the read/write sense amplifier 91 must not be delivered and the data held in the refreshing sense amplifier 92 must be delivered. Thus the address comparator circuit 15 shown in FIG. 4 is provided for detecting the coincidence between the latched address "A1" and the refreshing address "A_R1". If both the addresses coincide, AND gate 152 raises the address comparison signal HIT to a high level, thereby coupling the refreshing sense amplifier 92 to the read/write bus WRB to deliver the data saved in the refreshing sense amplifier 92 through the read/write bus WRB.

Figure 7:
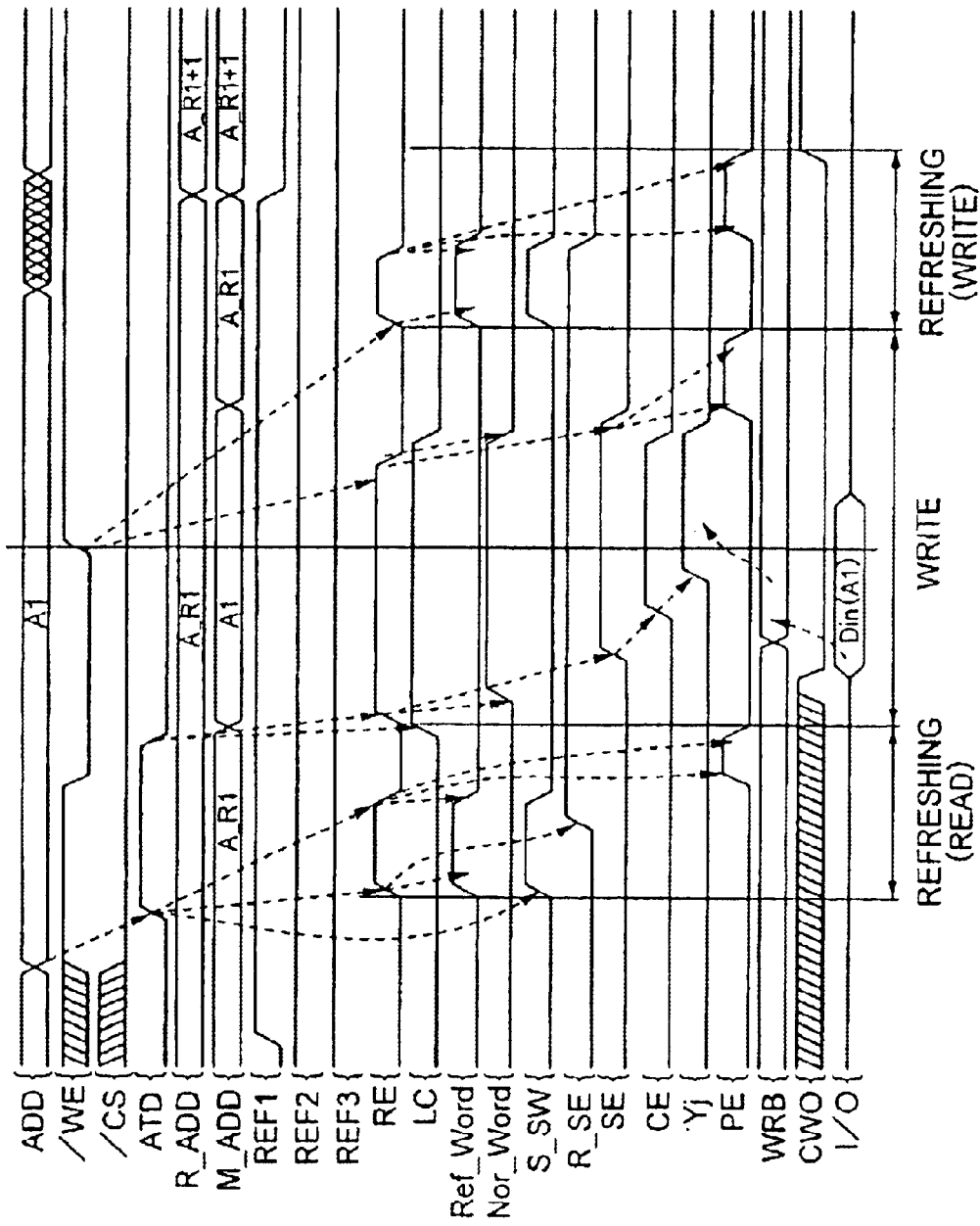
FIG. 7 is a timing chart of the refreshing operation and a write operation in the memory device of FIG. 1

Referring to FIG. 7, there is shown a timing chart in the case where the input address ADD changes when refreshing request signal REF1 assumes an active high level.

When the input address ADD changes, a positive one-shot pulse is generated in the address transition signal ATD. The high level of refreshing request signal REF1 and the rise of the address transition signal ATD allow the row control circuit 13 to generate a positive one-shot pulse in each of the row enable signal RE and sense amplifier selection signal S_SW, thereby selecting the word address Ref_Word of the refreshing address "A_R1" to start the read operation of the refreshing cycle.

Delay gate 19, NOR gate 20 and inverter 21 in the row control circuit 13 prevent generation of a series of write signals caused by the row enable signal RE, if the write enable signal /WE falls to a low level before the address transition signal ATD assumes a high level. That is, if the write enable signal /WE falls to a low level, the output of inverter 21 is delayed to assume a low level by the delay time set in delay gate 19.

In addition, if the output of inverter 21 falls to a low level during read operation of the refreshing cycle, the low level on the output of inverter 22 allows NAND gate 25 to maintain the high level. Thus, the write operation for the input address ADD is not started.

After the read operation of the refreshing cycle is completed, the fall of the address transition signal ATD allows NAND gate 25 to deliver a low level, thereby generating a positive one-shot pulse in the row enable signal RE, as in the case of the read operation. Thus, the word address Nor_Word of the input address "A1" is selected to start the write operation. Upon selection of the word address Nor_Word, the read/write sense amplifier selection signal SE rises to a high level for sensing and amplifying the data.

For storing the write data supplied from outside the memory device into the memory cell, the read/write bus WRB receives the write data through the input buffer in the I/O buffer block 10, and the column enable signal CE is raised to a high level, thereby allowing the column decoder 8 to decode the row address L_ADDn of the latched address L_ADD and deliver the bit line selection signal Yj. Thus, the write data on the read/write bus WRB is stored in the memory cell via the read/write sense amplifier 91. Since the write data is delivered from outside the memory device in response to the rising edge of the write enable signal /WE, the write data is stored in the memory cell by maintaining the row enable signal RE at a high level during the low level of the write enable signal /WE.

When the write enable signal /WE rises to a high level, NAND gate 25 delivers a high level, thereby allowing the row enable signal RE, sense amplifier enable signal SE, column enable signal CE and address latch signal LC to assume a low level to complete storage of the write data. The high level of NAND gate 25 allows NAND gate 30 to deliver a negative one-shot pulse, thereby selecting word address Ref_Word of the refreshing address "A_R1" to perform the write operation of the refreshing cycle similarly to the read operation.

If the refreshing address "A_R1" coincides with the input write address "A1", the refreshing data saved in the refreshing sense amplifier must not be stored in the original memory cell after the write data is stored in the original memory cell because the refreshing data is now an old data. In view of this, if the address comparison signal HIT assumes a high level, the refreshing sense amplifier 92 is coupled to the read/write bus WRB to update the data in the refreshing sense amplifier 92 by the write data on the read/write bus WRB.

Figure 8:
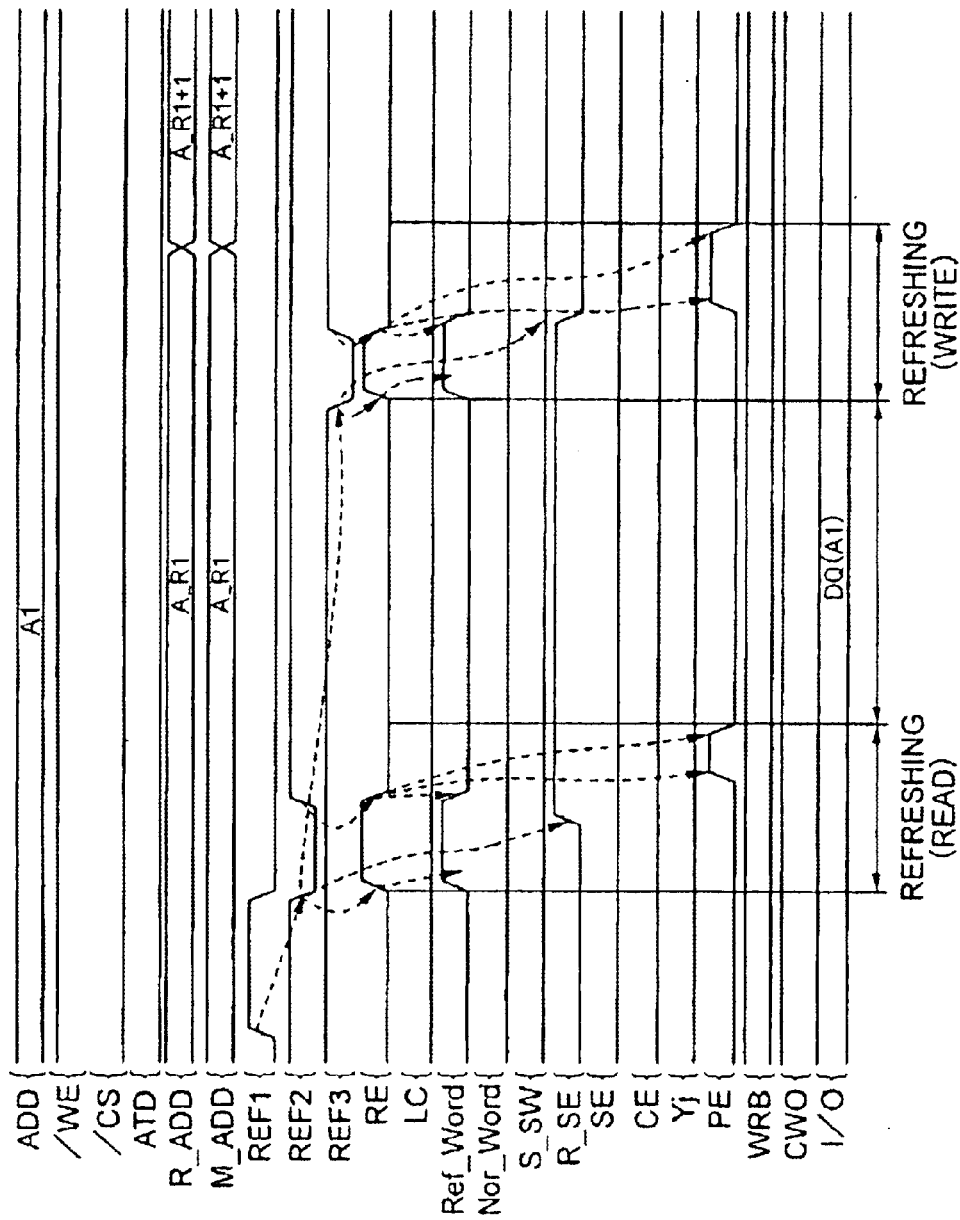
FIG. 8 is a timing chart of the refreshing operation controlled based on the refreshing timer.

Referring to FIG. 8, there is shown a timing chart wherein a trigger for generating the address transition signal ATD is not delivered from outside the memory device until a specified time length elapses after refreshing request signal REF1 rise to a high level.

When refreshing request signal REF1 rises to a high level, a pulse generator in the refreshing control circuit 4 is started for operation based on a signal obtained by delaying the rising edge of refreshing request signal REF1, thereby generating a negative one-shot pulse in refreshing request signal REF2. The fall of refreshing request signal REF2 allows NAND gate 49 in the row control circuit 13 to deliver a positive one-shot pulse in the row enable signal RE, thereby allowing NAND gate 38 and NOR gates 47 and 48 to deliver a one-shot pulse in the sense amplifier selection signal S_SW. The selected address M_ADD and the row enable signal RE signal select the word address Ref_Word of the refreshing address, thereby starting the read operation of the refreshing cycle.

After the word address Ref_Word is selected, next operation is waited for the time length needed for the read operation until the refreshing sense amplifier enable signal R_SE rises to a high level for the sensing and amplifying operation of the refreshing cycle. The refreshing sense amplifier enable signal R_SE is maintained at the high level for saving the data in the refreshing sense amplifier 92 until the refreshing data is rewritten in the memory cell. After the read operation is completed, a positive one-shot pulse is generated in the precharge enable signal PE for precharging the bit lines.

If a trigger for generating the address transition signal ATD is not delivered from outside the memory device within the specified time length after generation of the negative one-shot pulse in refreshing request signal REF2, the pulse generator is started by the signal obtained by delaying the falling edge of refreshing request signal REF2, thereby delivering a negative one-shot pulse in refreshing request signal REF3. The negative one-shot pulse in refreshing request signal REF2 allows NAND gate 49 in the row control circuit 13 to generate a positive one-shot pulse in the row enable signal RE, thereby allowing NAND gate 31, NOR gate 47 and inverter 48 to generate a positive one-shot pulse in the sense amplifier selection signal S_SW.

The selected address M_ADD and the row enable signal RE select the word address Ref_Word of the refreshing address, thereby starting the write operation of the refreshing cycle. The data saved in the refreshing sense amplifier 92 is then stored in the memory cell, followed by lowering the refreshing sense amplifier enable signal R_SE to a low level, thereby generating a positive one-shot pulse in the precharge enable signal PE to precharge the bit lines and thus completing the refreshing cycle.

Figure 9:
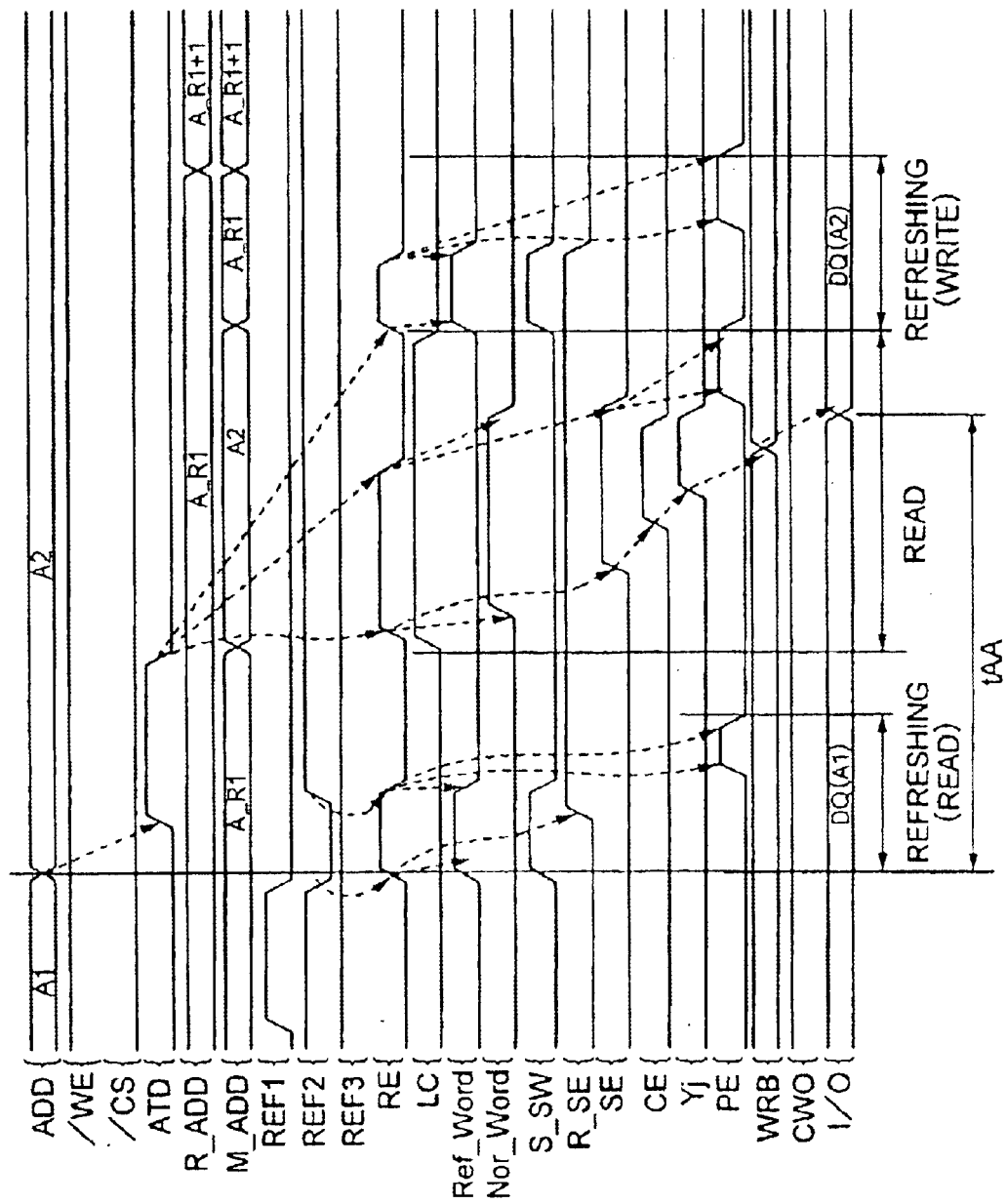
FIG. 9 is a timing chart of the refreshing operation and a read operation controlled based on the refreshing timer.

Referring to FIG. 9, there is shown a timing chart wherein a trigger for generating the address transition signal ATD is delivered from outside the memory device within the specified time length after generation of the negative one-shot pulse in refreshing request signal REF2. If the input address ADD is changed after the read operation of the refreshing cycle is started in response to the falling edge of refreshing request signal REF2, the ATD circuit 3 generates a positive one-shot pulse in the address transition signal ATD. Since refreshing request signal REF1 is reset in response to the generation of the negative one-shot pulse in refreshing request signal REF2, the read operation of the refreshing cycle, which otherwise starts in response to the rising edge of the address transition signal ATD, is not started. Thus, there arises no conflict between the read operation for the input address and the read operation of the refreshing cycle.

After the fall of the address transition signal ATD, the read operation for the input address "A2" is performed, similarly to the case of a high level of refreshing request signal REF1. This read operation does not conflict with the read operation of the refreshing cycle, because the pulse width of the one-shot pulse in the address transition signal ATD is adjusted to adapt the end of the refreshing cycle.

After the completion of the read operation for the input address "A2", the refreshing data saved in the refreshing sense amplifier 92 is rewritten in the refreshing address "A_R1". In this case, since the address transition signal ATD is activated after the negative one-shot pulse is generated in refreshing request signal REF2, a negative one-shot pulse is not generated in refreshing request signal REF3.

If a trigger for generating the address transition signal ATD is delivered from outside the memory device within the specified time length after generation of the negative one-shot pulse in refreshing request signal REF3, the read operation for the input address ADD is performed after the write operation of the refreshing cycle is completed, as will be understood from the above descriptions.

The read/write operation for the input address ADD may occur after the read operation or after the write operation of the refreshing cycle. Accordingly, the pulse width of the one-shot pulse in the address transition signal ATD should be determined to adapt the end of one of the read operation and the write operation of the refreshing cycle which continues for a longer time interval.

As described heretofore, the refreshing sense amplifier 92 and the address comparator circuit 15 provided in the above embodiment allow a read/write operation for the input address ADD to be performed while interrupting the refreshing cycle without destroying the data stored in the memory cell.

Figure 10:
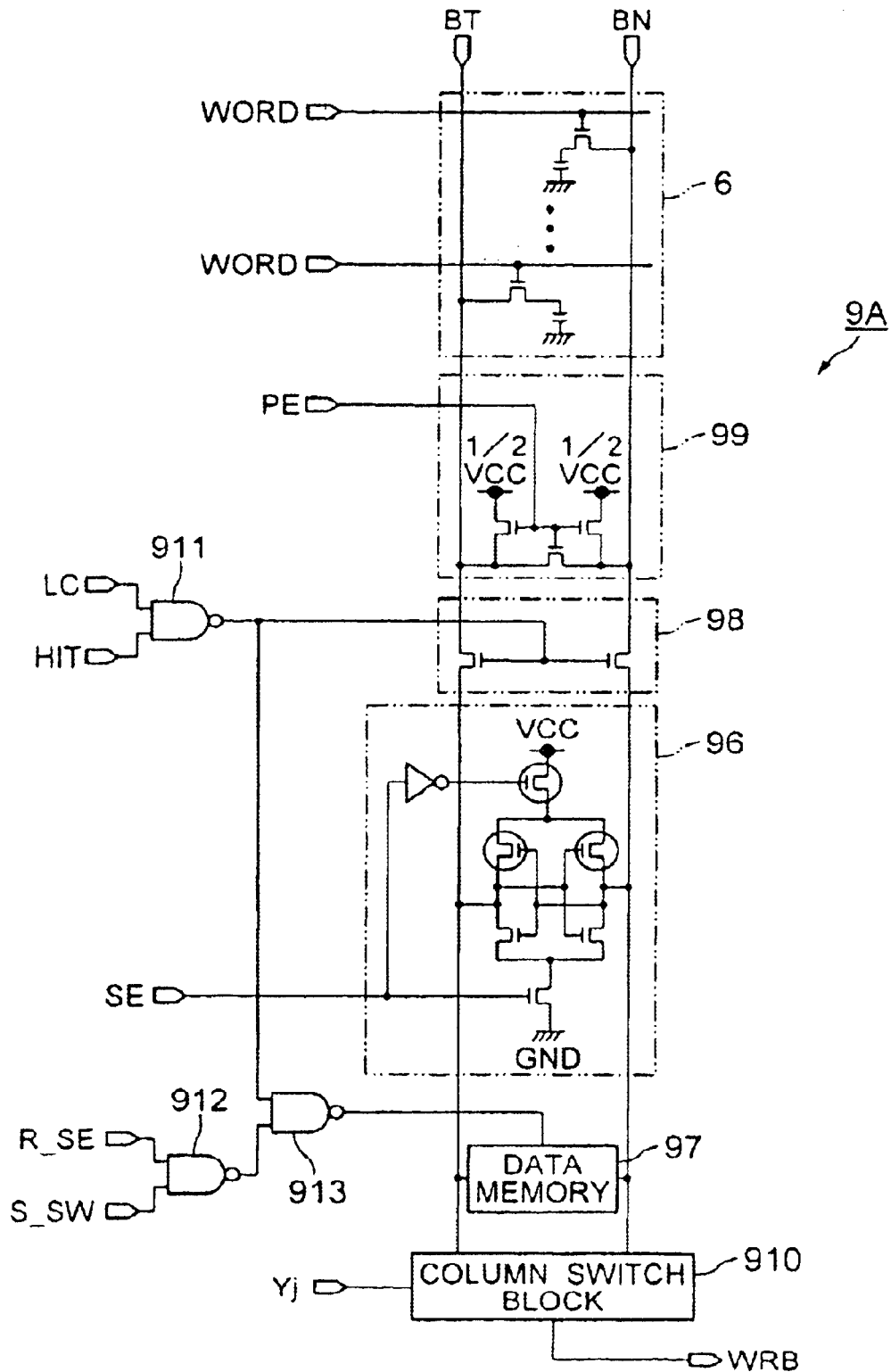
FIG. 10 is a schematic circuit diagram of the sense amplifier/switch circuit and associated memory cell array in a memory device according to a second embodiment of the present invention.
Figure 11:
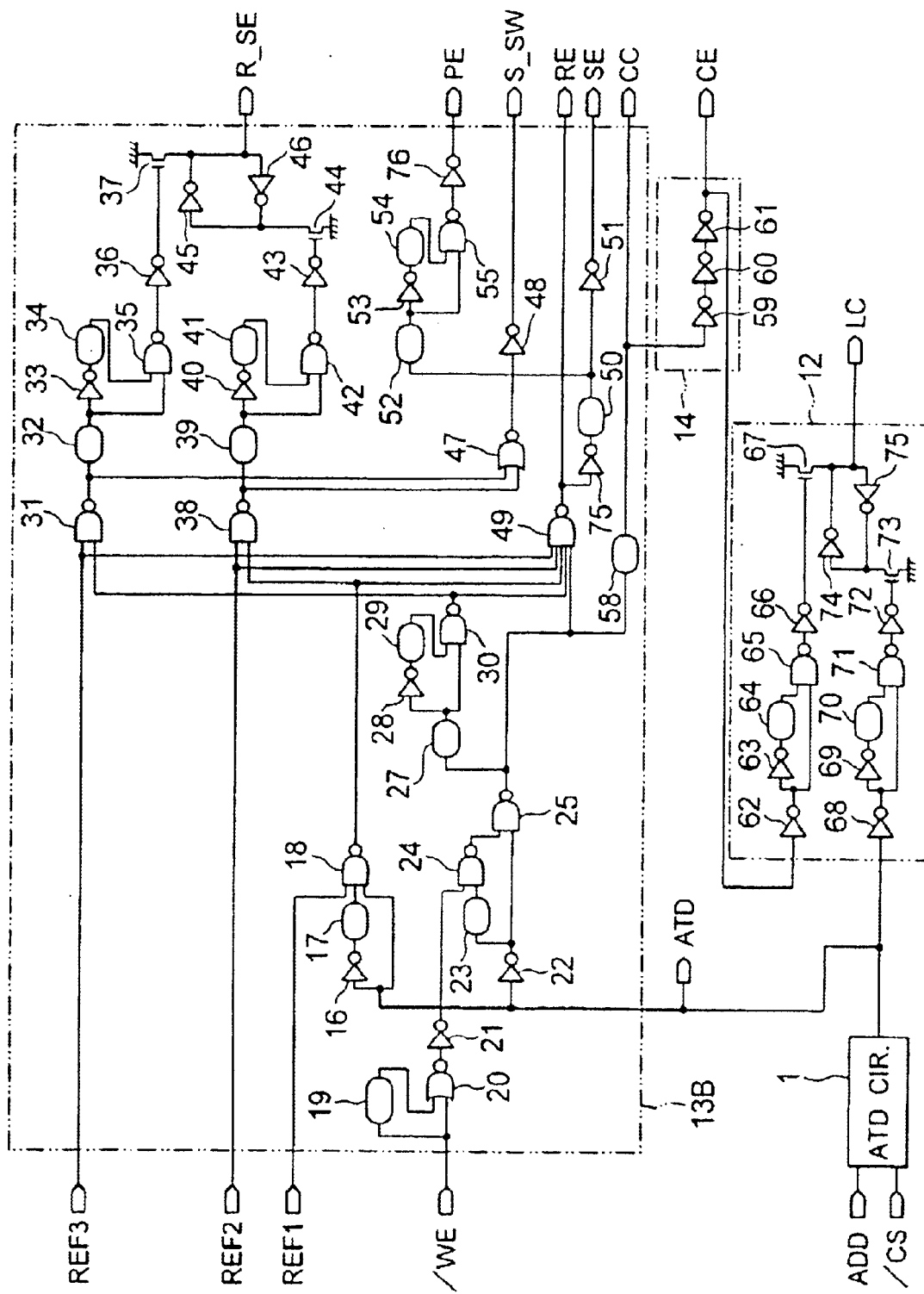
FIG. 11 is a circuit diagram of the row control circuit in the memory device of FIG. 10.

Referring to FIG. 10, there is shown a sense amplifier/switch circuit in a memory device according to a second embodiment of the present invention. FIG. 11 shows the row control circuit shown in FIG. 10.

The sense amplifier/switch circuit 9A of FIG. 10 is roughly similar to the sense amplifier/switch circuit 9 of FIG. 2 except that the refreshing sense amplifier 92 in FIG. 2 is replaced by a SRAM-type data memory 97 having a SRAM memory cell structure in FIG. 10 and that NAND gates 911 to 913 are provided in the sense amplifier/switch circuit 9A in FIG. 10.

More specifically, the sense amplifier/switch circuit of FIG. 10 includes sense amplifier circuit 96, SRAM-type data memory 97, switch block 98, precharge circuit 99, column switch circuit 910, and NAND gates 911 to 913.

The sense amplifier circuit 96 is used both for the read/write operation for the input address ADD and the refreshing operation. The switch block 98 couples the bit lines BT and BN to respective sense amplifiers in the sense amplifier circuit 96, The SRAM-type data memory 97 has a structure of either a full-CMOS SRAM memory cell or a high-resistance SRAM memory cell. The output of NAND gate 913 is connected to the gates of the transfer transistors of the SRAM-type data memory 97.

The row control circuit 13B shown in FIG. 11 generates a sense amplifier enable signal SE by responding to the rising edge of the row enable signal RE, and the precharge enable signal PE by responding to the falling edge of the row enable signal RE, during both the refreshing operation and a read/write operation.

In a read operation of the refreshing cycle in the second embodiment, NAND gate 911 delivers a high level due to a low level of the address latch signal LC, and the switch block 98 couples the bit lines BT and BN to the sense amplifier 96, thereby allowing the read-out of data from the DRAM memory cell. After the start of the refreshing operation, the sense amplifier selection signal S_SW rises to a high level, and the sense amplifier enable signal SE rises after waiting for the time length needed for the read-out, thereby allowing the sense amplifier to sense and amplify the read data. In addition, the rising edge of the refreshing sense amplifier enable signal R_SE allows NAND gate 912 to deliver a low level, and NAND gate 913 connected to the gates of transfer transistors of the SRAM-type data memory 97 delivers a high level, whereby the data is stored in the SRAM-type data memory 97 via the sense amplifier 96.

In a write operation of the refreshing cycle, since the refreshing sense amplifier enable signal R_SE assumes a high level, the falling edge of the sense amplifier selection signal S_SW allows NAND gate 913 to deliver a high level to select the SRAM-type data memory 97. Thus, the data saved in the SRAM-type data memory 97 is delivered onto the bit lines BT and BN, followed by storing data into the DRAM memory cell while sensing and amplifying the data on the bit lines at the rising edge of the sense amplifier enable signal SE In a read/write operation for the input address ADD, the switch block 98 couples the bit lines BT and BN to the sense amplifier 96, thereby allowing read/write operation for the DRAM memory cell selected by the input address ADD. However, if the refreshing address R_ADD coincides with the row address L_ADDm of the latched address L_ADD, the address comparison signal HIT allows the switch block 98 to stay in a non-selected state, whereby the read/write operation is conducted for the SRAM-type data memory 97 instead of the DRAM memory cell. In the case of a write operation, data is stored in the DRAM memory cell by using the write operation of the refreshing cycle.

In the above embodiment, by using the SRAM-type data memory for saving therein the data read out in the read operation of the refreshing cycle, the chip size can be reduced compared to the case of using a refreshing sense amplifier 92.

It may be considered that the word selection and precharge operation, conducted twice for a single refreshing operation as a result of separation of the write operation from the read operation in the refreshing cycle, cause an increase of power dissipation. However, since the refreshing cycle requires a power consumption of only several tens to a hundred micro-amperes which is far smaller than the power dissipation of several tens of milli-amperes during a single read/write operation for the input address, the increase of power dissipation is limited. In addition, since the refreshing cycle is generally between several milli-seconds and several tens of milli-seconds depending on the structure and the capacity of the memory cell array as well as the process conditions in the fabrication process, the refreshing operation need not be performed at each time the one-shot pulse occurs in the address transition signal ATD due to the change of the input address ADD or chip select signal /CS.

Figure 13:
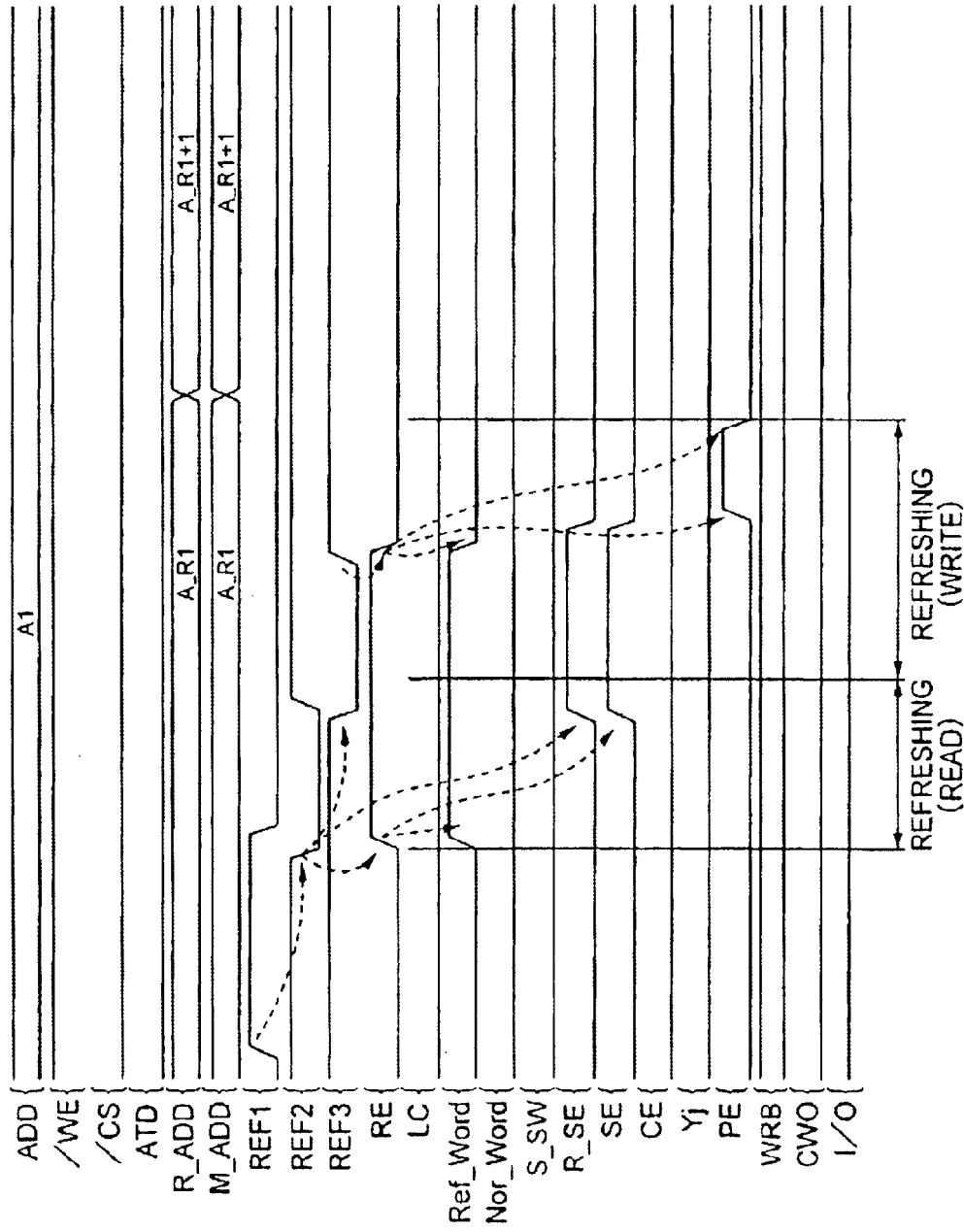
FIG. 13 is a timing chart of the refreshing operation during a standby mode in the memory device of FIG. 10.
Figure 14:
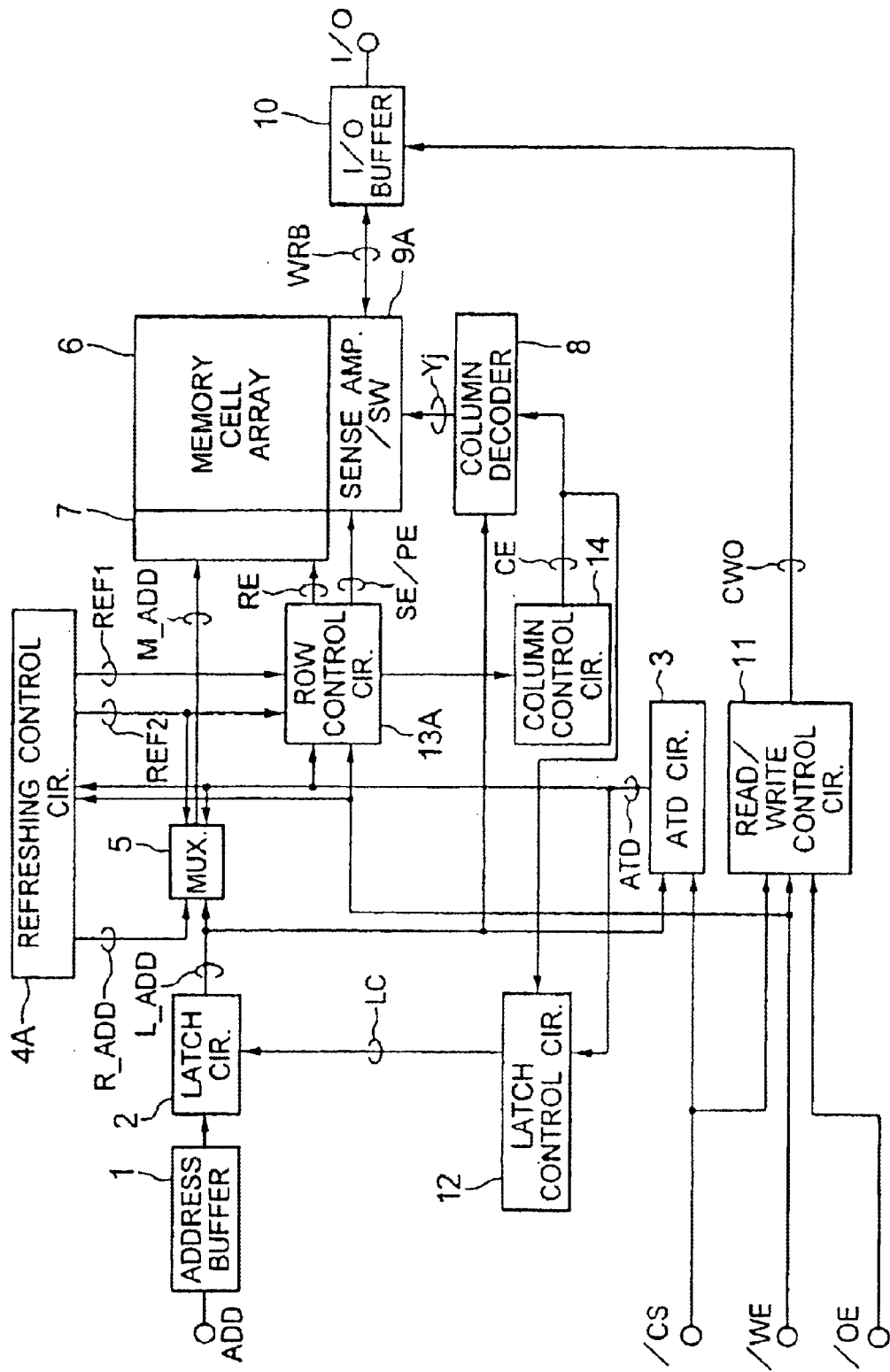
FIG. 14 is a block diagram of the first conventional memory device.
Figure 15:
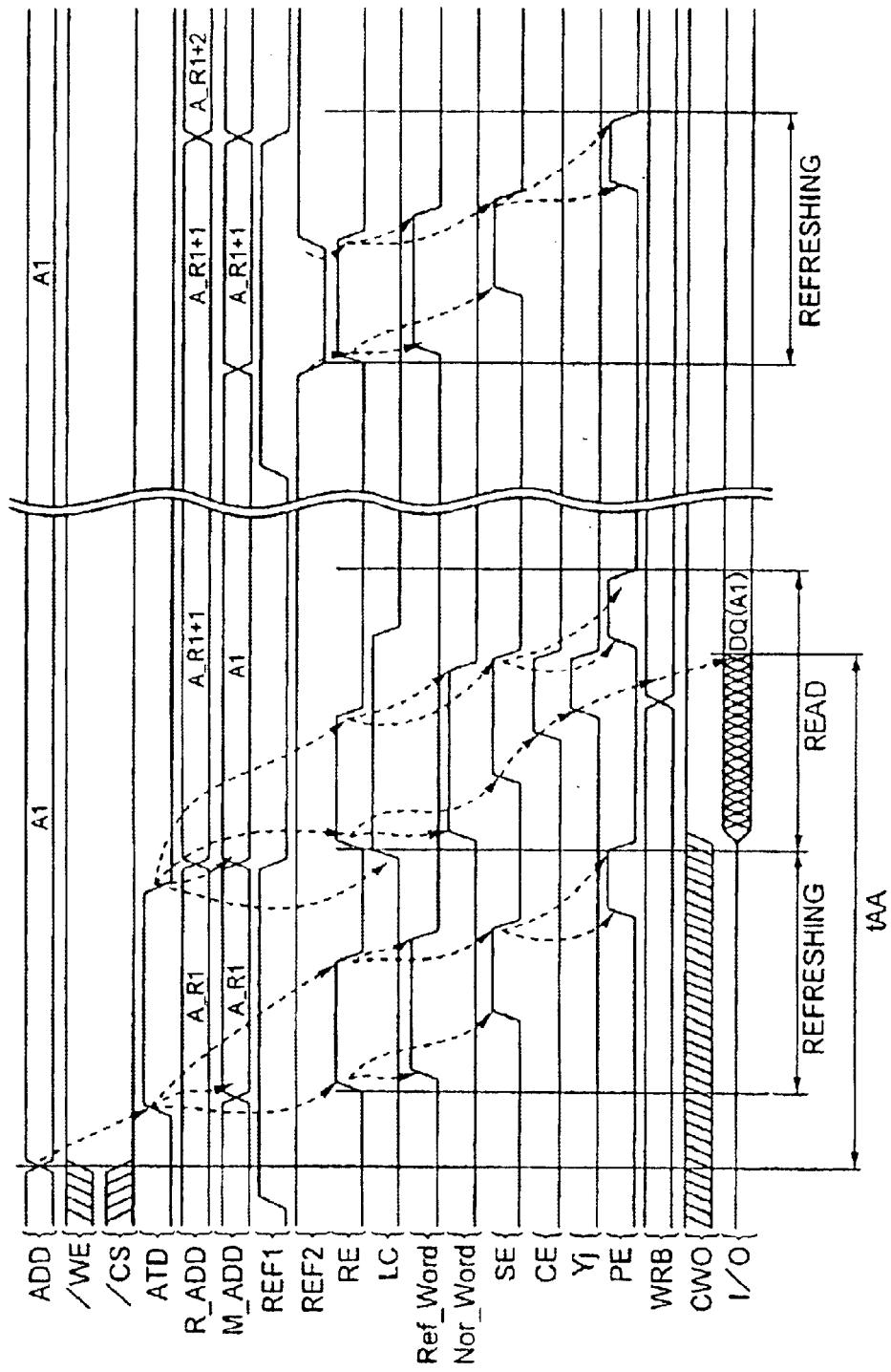
FIG. 15 is a timing chart of the first conventional memory device.
Figure 16:
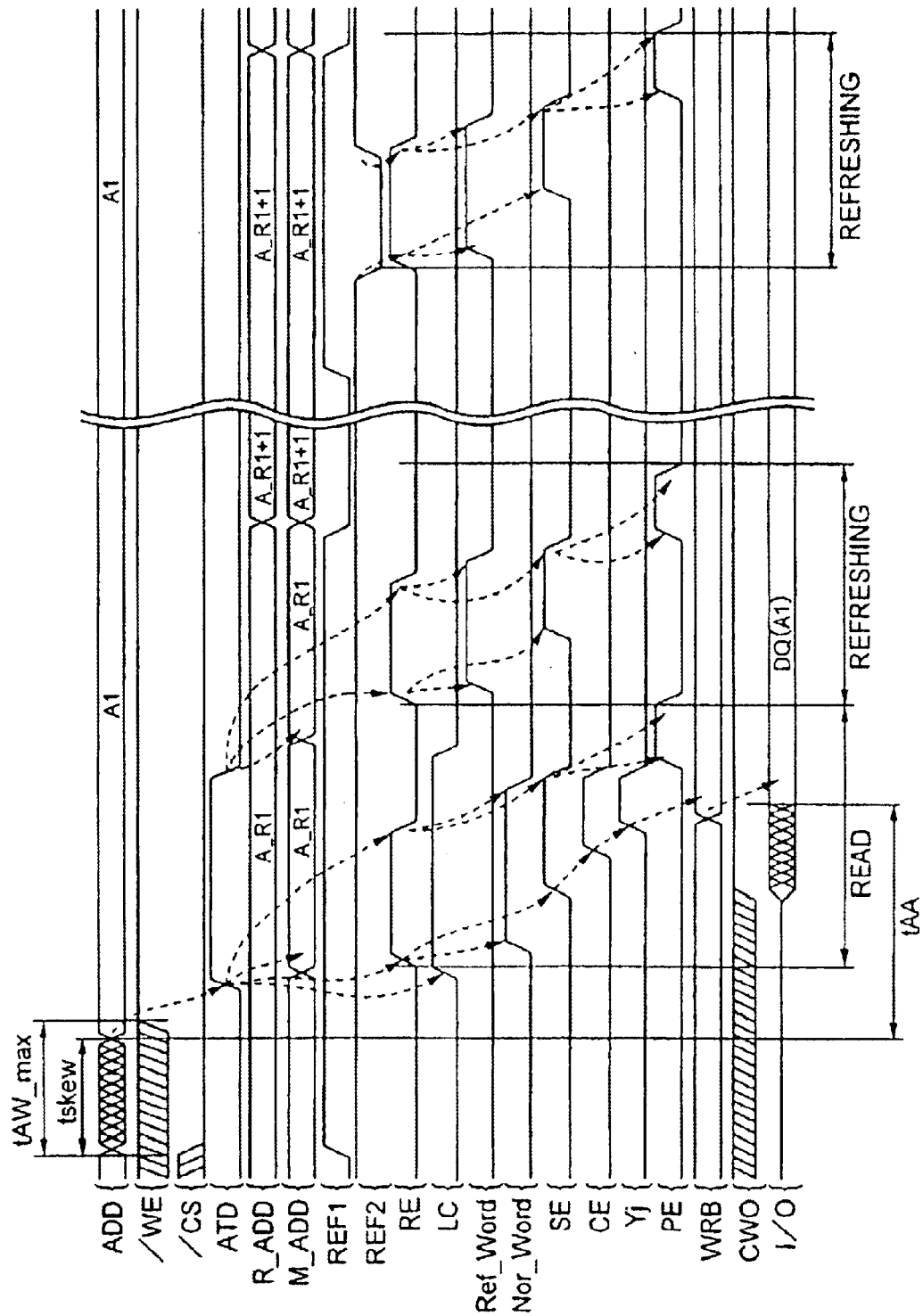
FIG. 16 is a timing chart of the second conventional memory device.

It is to be noted that the power dissipation during a standby mode of the memory device, wherein a read/write operation does not occur, corresponds to the power dissipation of a single refreshing cycle and thus does increase. For reducing the power dissipation during the standby mode, the delay times of a plurality of delay gates determining the time intervals between generation of the negative one-shot pulse in refreshing request signal REF2 and generation of refreshing request signal REF3 should be switched to obtain a smaller interval during the standby mode by using the chip select signal /CS. FIG. 13 shows a timing chart of such a case, wherein refreshing request signal REF2 and refreshing request signal REF3 are generated in the refreshing cycle to prevent occurrence of twice of the positive one-shot pulse in the row enable signal RE.

Figure 12:
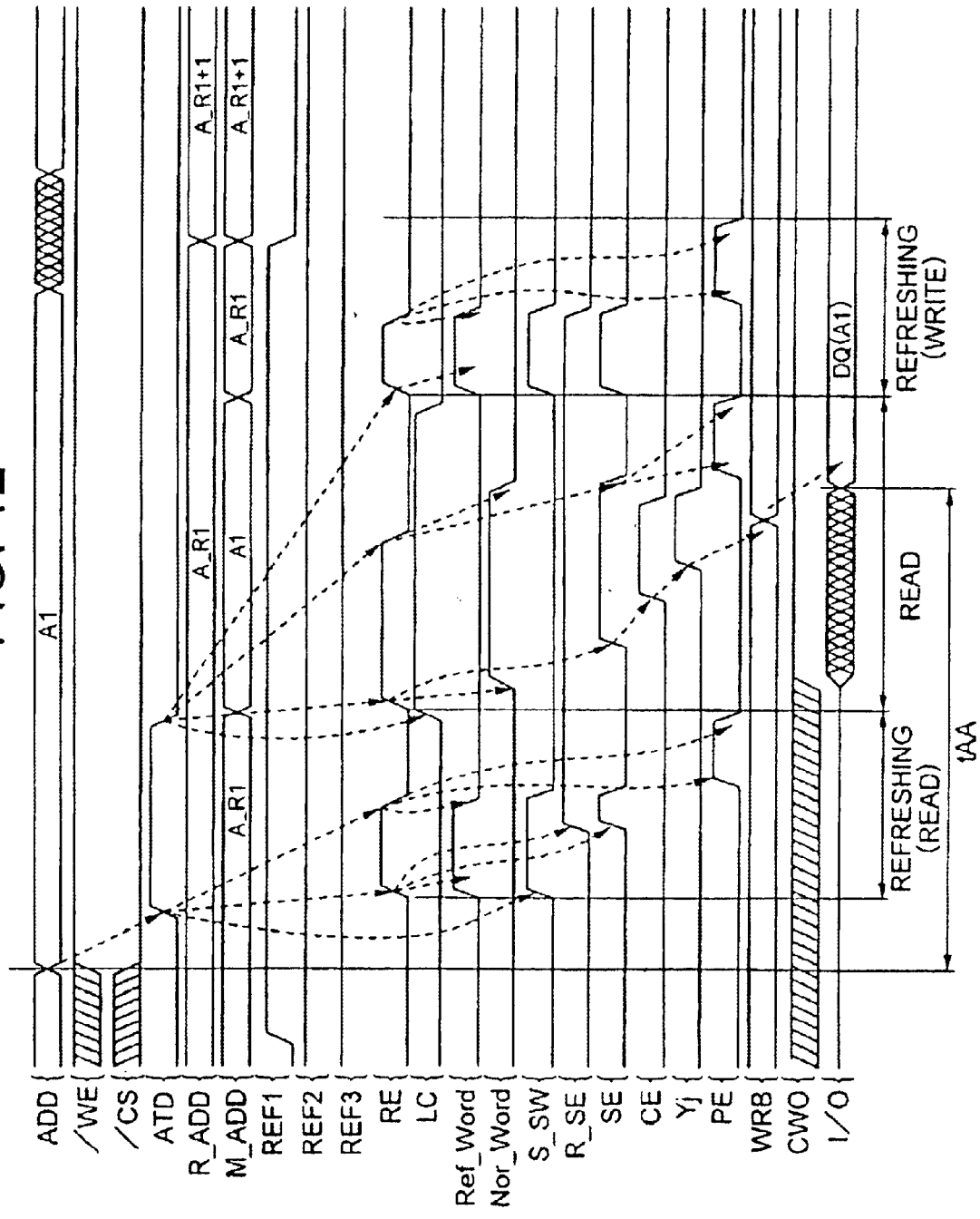
FIG. 12 is another timing chart of the refreshing operation and a read operation in the memory device of FIG. 1

FIG. 12 shows another timing chart for the refreshing operation and a read operation in the memory device of the first embodiment. In the row control circuit operating according to the timing chart of FIG. 12, since the precharge enable signal PE is not activated after the read operation of the refreshing cycle, the refreshing operation is conducted without destroying the data stored in the memory cell in the precharge cycle. Since the refreshing cycle is not separated into the read operation and the write operation during the standby mode, the power dissipation can be reduced by using a single word selection and a single precharge operation during a single refreshing cycle.

As described above, the memory devices of the above embodiments have the following advantages.

(1) Due to the separation of the write operation from the read operation in a refreshing cycle, the read time for the input address ADD can be reduced by the time length needed for a writing operation of the refreshing cycle if the read operation for the input address is performed after the read operation of the refreshing cycle. On the other hand, if the read operation for the input address is performed after the write operation of the refreshing cycle, the read time can be reduced by the time length needed for read out in the refreshing cycle. For example, if the self refreshing time, the read time and write time of the refreshing cycle, and the precharge time after the read operation of the refreshing cycle are 20 ns, 10 ns, 10 ns and 2 ns, respectively, the read time can be reduced by 8 ns.

The reason is as follows. The read operation for the input address can be performed in the above embodiments after the read operation of the refreshing cycle, whereas the read operation for the input address cannot be performed before the read and write operation of the refreshing cycle is completed in the conventional technique.

(2) Since the refreshing cycle can be started before a read/write operation for the input address, there is no restriction between the address transition and the establishment of the write enable signal (3) By using a SRAM-type data memory for saving the refreshing data, the chip size can be reduced.

(4) The power dissipation can be reduced by several microamperes if separation of the write operation from the read operation of the refreshing cycle is not effected during a standby mode.

(5) The reduced read time, reduced by separation of the refreshing cycle, for the input address can be allocated both to the read time and the write time of the refreshing cycle. This raises the margin of the read operation and a restore efficiency to increase the interval of the refreshing cycle.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising:
    a memory cell array including a plurality of memory cells each having a DRAM cell structure;
    an input block for receiving an input address for a read/write operation from outside said memory device, said input block generating an address transition signal upon receipt of said input address;
    a refreshing control circuit for controlling a refreshing cycle of said memory cell array, said refreshing control circuit generating a refreshing address for which data refreshing is to be performed; and
    a sense amplifier circuit for amplifying and reading/writing data from/into one of said memory cells specified by said input address or said refreshing address, said sense amplifier circuit including a temporary data memory for saving refreshing data read from said memory cell during said refreshing cycle, wherein said temporary data memory saves said refreshing data if said address input block generates said address transition signal during said refreshing cycle.

2. The semiconductor memory device according to claim 1, wherein said refreshing cycle includes a read operation and a write operation, and a read/write operation for said input address is performed between said read operation and said write operation of said refreshing cycle.

3. The semiconductor memory device according to claim 1, wherein said temporary data memory is a refreshing sense amplifier block provided separately from a read/write sense amplifier block provided for said read/write operation for said input address.

4. The semiconductor memory device according to claim 1, further comprising a comparator for comparing said input address against said refreshing address to generate a coincidence signal upon coincidence therebetween, wherein a read data for said input address is delivered to outside said memory device from said temporary data memory upon generation of said coincidence signal.

5. The semiconductor memory device according to claim 4, wherein a write data received by said input block in connection with said input address is stored in one of said memory cells specified by said input address upon generation of said coincidence signal, instead of said refreshing data saved in said temporary data memory, during a write operation of said refreshing cycle.

6. The semiconductor memory device according to claim 1, wherein said temporary data memory is a SRAM-type data memory.

7. The semiconductor memory device according to claim 1, wherein said read operation and said write operation of said refreshing cycle are successively performed in a standby mode of said memory device.

8. The semiconductor memory device according to claim 7, wherein said refreshing control circuit detects said standby mode based on a chip select signal.

9. A method for controlling a semiconductor memory device having a DRAM cell structure, said method comprising the steps of:
    reading first data from a first memory cell specified by a refreshing address into a sense amplifier circuit to save said first data therein in a refreshing cycle;
    responding to an input address delivered for reading/writing second data in a second memory cell, to sense and amplify said second data in said sense amplifier circuit in a read/write cycle while saving said first data; and
    writing said first data saved in said sense amplifier circuit into said first memory cell in said refreshing cycle.

10. The method according to claim 9, further comprising the steps of:
    comparing said input address against said refreshing address; and
    outputting said first data saved in said sense amplifier circuit instead of said second data upon coincidence between said input address and said refreshing address.

11. The method according to claim 10, wherein said writing step stores said second data into said first memory cell instead of said first data saved in said sense amplifier circuit upon coincidence between said input address and said refreshing address.

* * * * *